United States Patent

Eden

[11] Patent Number: 6,111,254
[45] Date of Patent: Aug. 29, 2000

[54] INFRARED RADIATION DETECTOR

[75] Inventor: Dayton D. Eden, Dallas, Tex.

[73] Assignee: Lockheed Martin Corporation, Bethesda, Md.

[21] Appl. No.: 07/451,715

[22] Filed: Nov. 22, 1989

Related U.S. Application Data

[63] Continuation-in-part of application No. 07/092,736, Aug. 5, 1987, which is a continuation-in-part of application No. 06/901,071, Jul. 14, 1986.

[51] Int. Cl.$^7$ .............................. G01J 5/00; H01Q 1/00; H01L 29/80; H01L 31/00
[52] U.S. Cl. ................... 250/338.1; 257/258; 257/275; 257/442; 257/448; 343/721; 343/727; 343/793; 250/338.4; 250/332
[58] Field of Search ................... 250/332, 338.4, 250/338.1; 357/30.11; 257/258, 275, 442, 448; 343/721, 727, 793

[56] References Cited

U.S. PATENT DOCUMENTS

| | | |
|---|---|---|
| 3,755,678 | 8/1973 | Javan . |
| 4,445,050 | 4/1984 | Marks . |
| 4,591,717 | 5/1986 | Scherber ........................... 250/338.4 |
| 4,614,957 | 9/1986 | Arch et al. ................................ 357/30 |
| 4,639,756 | 1/1987 | Rosbeck et al. ......................... 357/30 |
| 4,731,640 | 3/1988 | Bluzer ....................................... 357/30 |
| 4,875,084 | 10/1989 | Tohyama ................................... 357/30 |

FOREIGN PATENT DOCUMENTS

2051477  1/1981  United Kingdom .

OTHER PUBLICATIONS

Schwarz et al, J. Appl. Phys., vol. 48, #5, May 1977, p. 1870.
Rutledge et al, IEEE J. Quantum Electronics, vol. QE 17, #3, Mar. 1981.
Schulman et al, Appl. Phys. Lett. 34(10), May 1979, p. 663.
Smith, J. Appl. Phys., 53(10), Oct. 1982, p. 7051.
Hwang et al, App. Phys. Lett. 34(11), Jun. 1979, p. 773.
Smith, J. Appl. Phys. 56(6), Sep. 1984, p. 1663.
Smith et al, Appl. Phys. Lett. 45(1), Jul. 1984, p. 83.
Faurie et al, Appl. Phys. Lett., 45(12), Dec. 1984, p. 1307.

*Primary Examiner*—Stephen C. Buczinski
*Attorney, Agent, or Firm*—Sidley & Austin; Stephen S. Sadacca

[57] ABSTRACT

An infrared radiation detector is disclosed which is fabricated on a dielectric substrate. The detector utilizes photosensitive segments which are included within elongate members disposed on the surface of the substrate. The elongate members comprise photosensitive detector segments which are located between and contact non-photosensitive segments and the entirety of each strip is electrically conductive. The elongate members are preferably offset from each other by less than the wavelength of the radiation and the photosensitive segments within the elongate members are also preferably spaced apart by less than the wavelength of the radiation. A reflective plane, typically an aluminum layer, is offset from the plane of the detector segments by less than the wavelength of the radiation. Incident radiation is captured by the overall detector structure which includes the reflective plane and the elongate members which include both photosensitive and non-photosensitive segments. The radiation power is transferred to the photosensitive detector segments to produce a detection signal. The detection signals are combined along the length of the elongate members and conveyed through electrical conductors at the ends of the members to produce a composite radiation detection signal. A plurality of the detectors can be combined to produce an infrared imager.

55 Claims, 12 Drawing Sheets

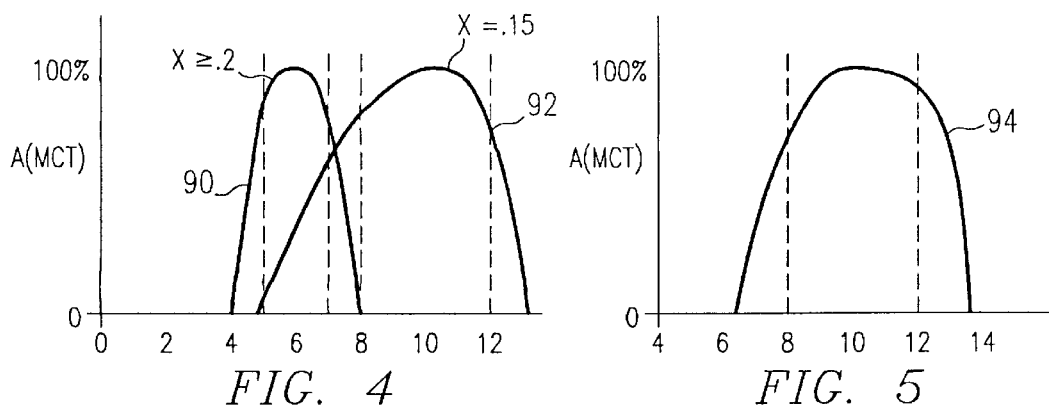
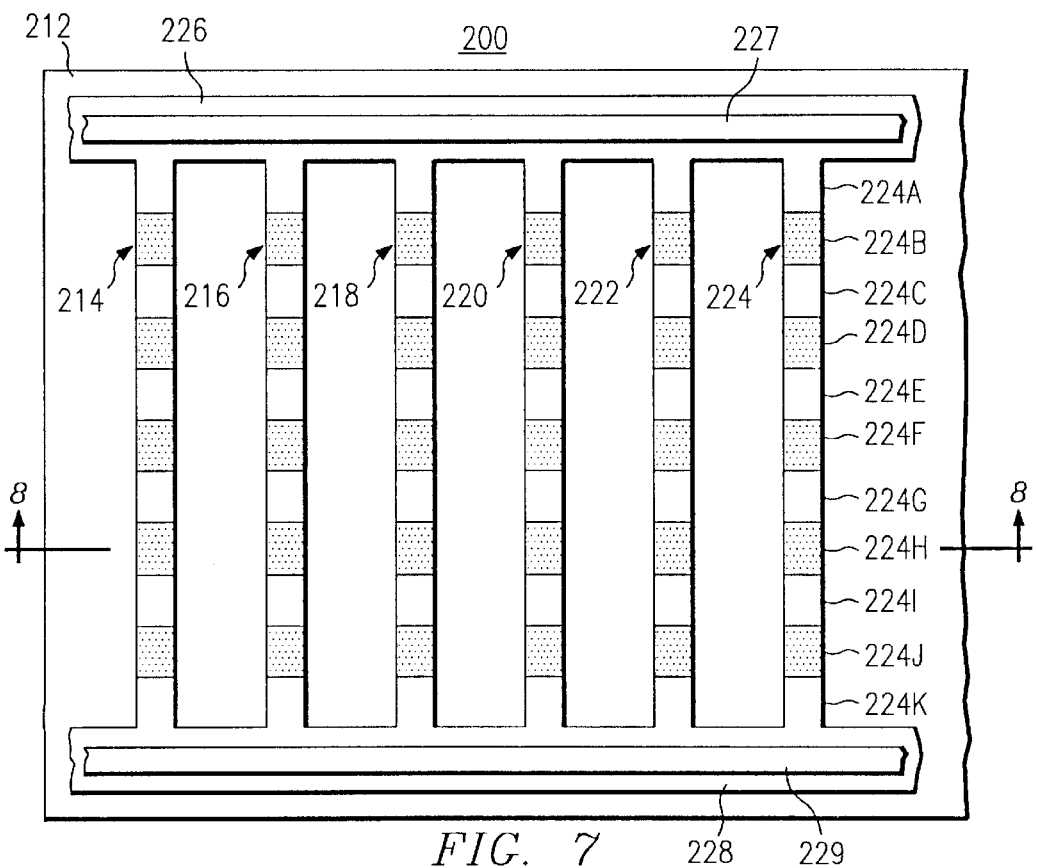
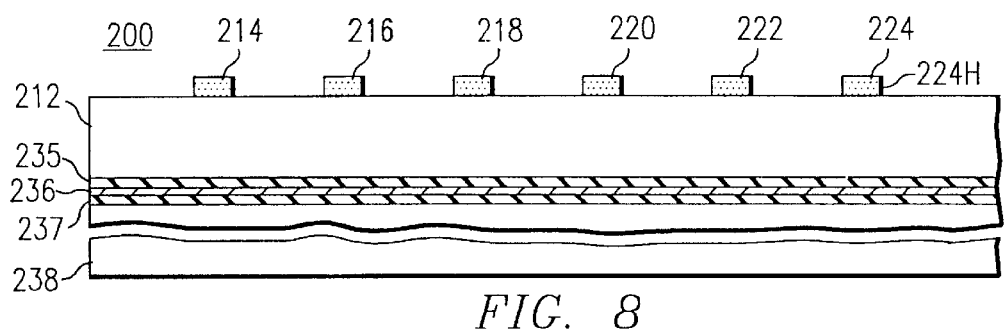

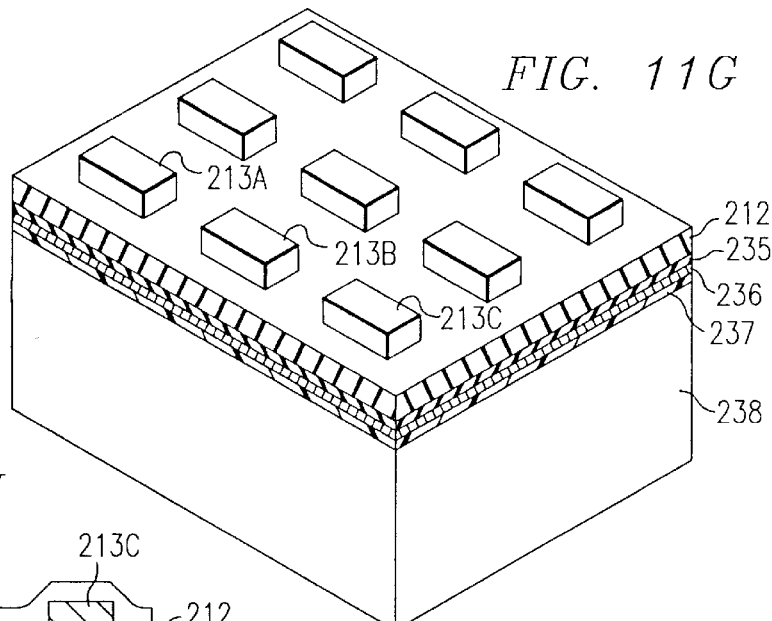
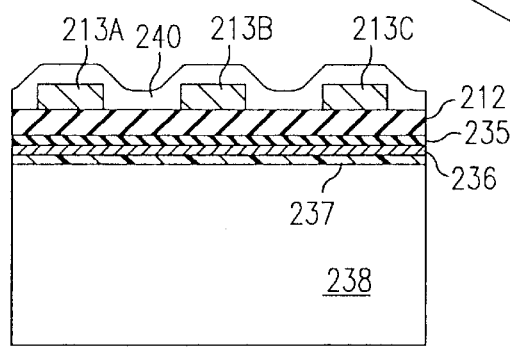
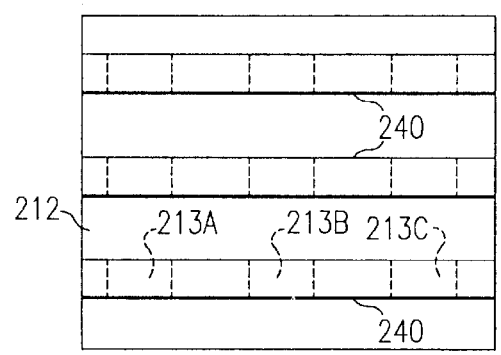
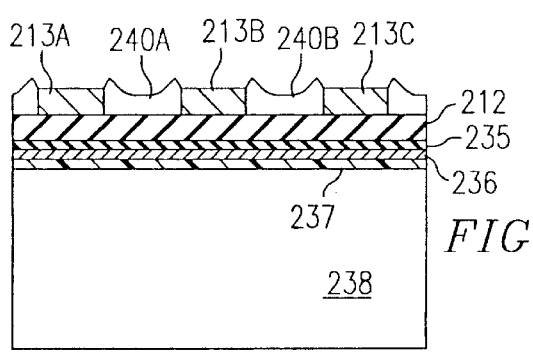
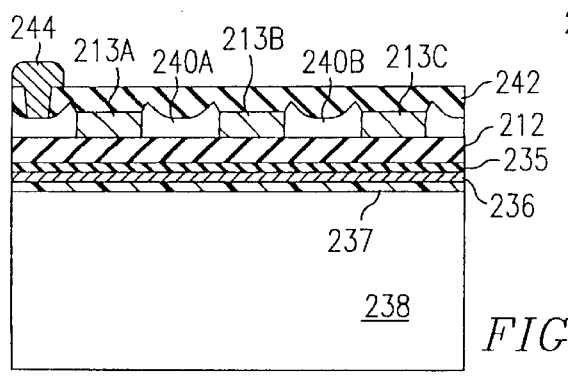
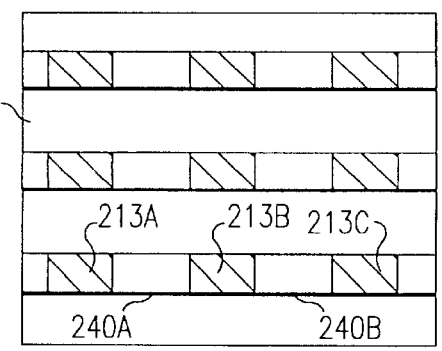

INFRARED RADIATION DETECTOR

RELATED APPLICATIONS

This application is a continuation-in-part of prior application Ser. No. 07/092,736 filed Aug. 5, 1987 and entitled Bandgap Radiation Detector, which is a continuation-in-part of application Ser. No. 06/901,071 filed Jul. 14, 1986.

FIELD OF THE INVENTION

The present invention pertains in general to radiation detectors and in particular to such detectors which operate at short wavelengths, such as in the infrared region.

BACKGROUND OF THE INVENTION

Infrared radiation detectors have long been used for producing thermal images which makes it possible to observe scenes at night or through clouds, smoke and dust. A conventional infrared detector is a large scale device, that is, each detector element is much larger than the wavelength of the incident radiation. Such conventional detector elements are purposely designed to be relatively large in order to insure that there is an adequate collection area for the incident radiation. Further, such detectors are made relatively thick to absorb penetrating incident radiation.

A principal limitation in the use of conventional infrared detectors has been the requirement that the detectors be enclosed within a cold chamber. The cooling is required to raise the detectivity of the detector to a usable level. Such cooling is typically provided by the evaporation of liquid gases, such as nitrogen. However, the storage, piping and handling of coolants such as liquid nitrogen is a difficult, expensive and time consuming task. Conventional large area detectors further have relatively low detectivity which reduces the sensitivity of the detector system.

In view of the need for thermal imaging and the difficulties associated with the use of such infrared detectors, such as cooling and low detectivity, there exist a need for an infrared detector which has a much higher detectivity and, as a result, can produce a useful signal at ambient temperature thereby eliminating or reducing the need for cooling equipment.

SUMMARY OF THE INVENTION

A selected embodiment of the present invention is an infrared radiation detector which includes a plurality of elongate, segmented, electrically conductive members. Each of the members comprises a group of photosensitive segments, which are responsive to the infrared radiation and a group of interconnecting, non-photosensitive conductive segments which are not responsive to the infrared radiation. The conductive members are preferably spaced apart by less than the wavelength of the infrared radiation. The photosensitive segments and the non-photosensitive segments are positioned alternately along each of the members. The photosensitive segments are preferably spaced apart from each other by less than the wavelength of the infrared radiation. A plane is provided which is reflective to the infrared radiation. This plane is parallel to but offset from the plane of the photosensitive elements by a distance which is less than the wavelength of the infrared radiation. Electrical connections are provided to the elongate, segmented, electrically conductive members for conveying signals which are produced by the photosensitive elements in response to the infrared radiation.

In a still further aspect of the present invention, there are provided parallel, elongate, electrically conductive members extending transversely across the segmented, electrically conductive members for enhancing the capture of the incident radiation by the infrared radiation detector.

In a still further aspect of the the present invention, a plurality of the infrared radiation detectors are combined to produce an infrared imager.

BRIEF DESCRIPTION OF THE DRAWINGS

For a more complete understanding of the present invention and the advantages thereof, reference is now made to the following Description taken in conjunction with the accompanying Drawings, in which:

FIG. 4 is a chart illustrating the radiation absorption of mercury cadmium telluride at room temperature for two different concentrations of mercury;

FIG. 5 is an illustration of the overall absorption of the infrared radiation detector illustrated in FIG. 1;

FIG. 7 is a plan view for an alternate design for an infrared detector in accordance with the present invention;

FIG. 8 is a section view taken along the lines 8—8 of the detector shown in FIG. 7;

FIGS. 11A–11L illustrate steps in the process of making the detector illustrated in FIGS. 7–9.

DETAILED DESCRIPTION OF THE INVENTION

Figure 1:
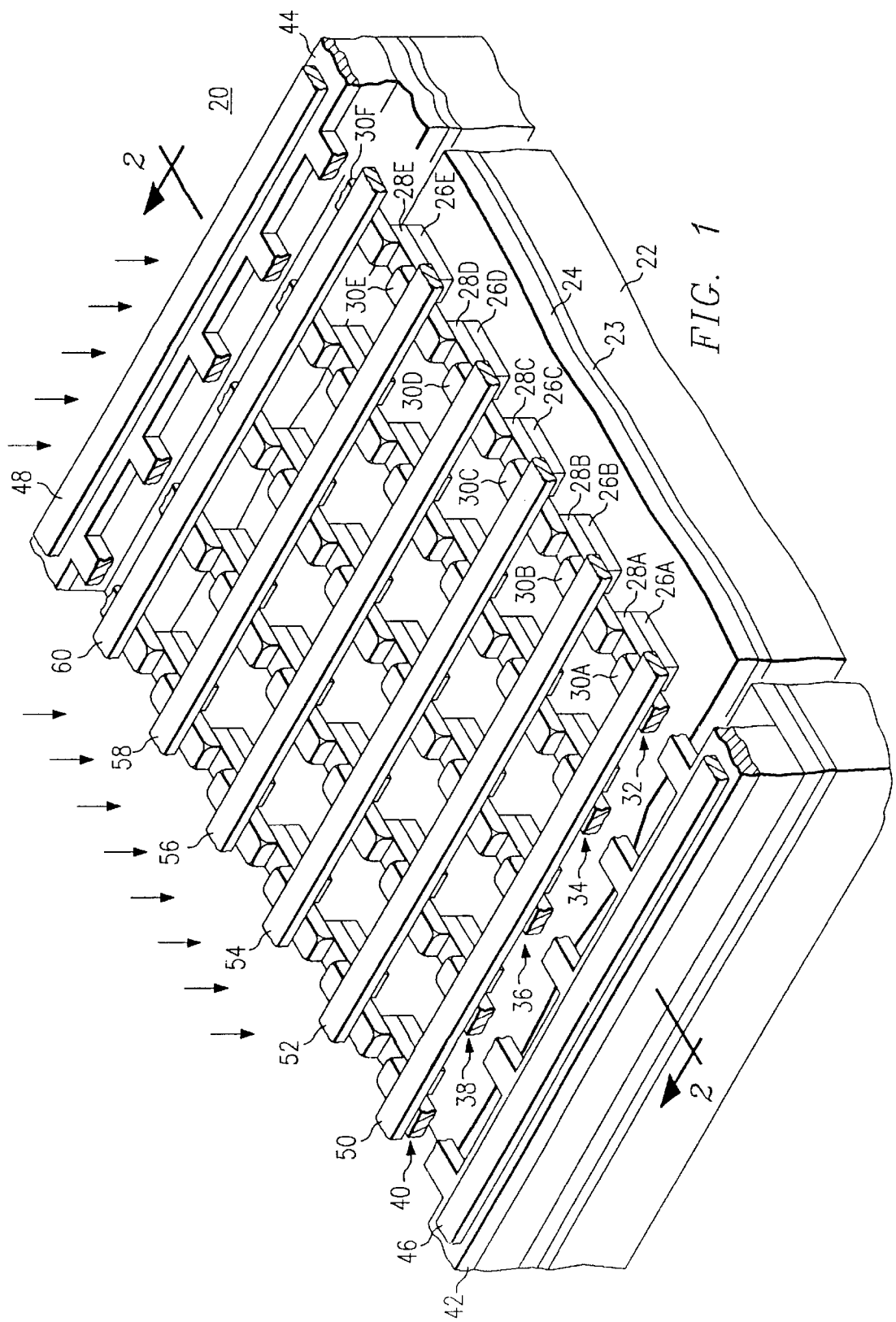
FIG. 1 is a perspective view of a pixel element of an infrared detector in accordance with the present invention.
Figure 2:
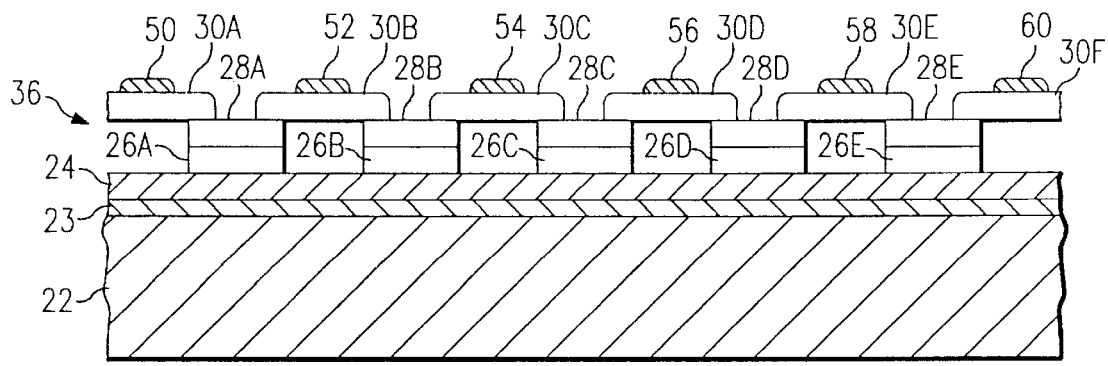
FIG. 2 is a section view taken along lines 2—2 of the detector shown in FIG. 1.

An infrared detector 20 in accordance with the present invention is illustrated in a perspective view in FIG. 1 and as a section view in FIG. 2. These views are not necessarily to scale. A detailed description for the steps of fabricating the detector 20 are presented in FIGS. 3A–3K. Detector 20 includes a substrate 22, which is preferably made of sapphire but optionally may be cadmium telluride or silicon. The preferred thickness of substrate 22 is approximately 2 millimeters. On the upper surface of the substrate 22 there is provided a reflecting plane 24, which is preferably a layer of aluminum having a thickness of approximately 500–1,000 angstroms. An epoxy bonding layer 23 binds the reflecting plane 24 to the substrate 22.

On the surface of the plane 24, there is provided a rectangular array of insulating blocks represented by the blocks 26A–26E. These blocks are preferably made of cadmium telluride and have approximate lateral dimensions of 4 microns by 1 micron and are approximately 0.3 microns thick. The center to center spacing of these blocks is approximately 8 microns. All of the dimensions set forth for the detector 20 are based upon a design having optimal response over a wavelength band of 8–12 microns for the incident infrared radiation. The dimensions would be proportionately scaled for a different wavelength.

Immediately above each of the insulating blocks 26A–26E is a set of segments which are photosensitive to infrared radiation in the 8–12 micron range. These are photosensitive segments 28A–28E which have essentially the same lateral dimension as segments 26A–26E and a thickness of approximately 0.5 micron. These segments comprise mercury cadmium telluride (MCT) having an X ratio of approximately 0.15, corresponding to an operating temperature of 300 K. Mercury cadmium telluride is specified by fractional parts in which the fractional part of the cadmium is represented by the alloy ratio X and the fractional part of mercury is represented by 1–X.

The junction between the blocks 26A–26E and the corresponding segments 28A–28E is a blocking junction which prevents the transfer of all carriers, both majority and minority. This junction can be made by having a sharp transition between the photosensitive and non-photosensitive segments.

Positioned immediately above the photosensitive segments 28A–28E are bridging, non-photosensitive segments 30A–30F. The bridging segments 30A–30F comprise mercury cadmium telluride in which the X alloy ratio is greater than or equal to 0.2. With this X ratio, the segments 30A–30F are not photosensitive to infrared radiation in the wavelength band of 8–12 microns at an operating temperature of approximately 300 K. Each of the segments 30A–30F bridges across a pair of the segments 28A–28E. For example, segment 30B bridges across segments 28A and 28B. For each of the segments 30A–30F a preferred length is approximately 6 microns, a preferred width is 1 micron and a preferred thickness is 0.25 microns. The gap between the segments 30A–30F is approximately 2 microns.

Each of the segments 30A–30F is in contact with two of the segments 28A–28E. The junction between these segments is a selective blocking junction, a heterojunction. This junction blocks minority carrier but allows majority carriers to pass through. In the preferred embodiment, the minority carriers are P-type holes and the majority carriers are electrons. Therefore, the electrons pass freely through the junction while the P-type holes are blocked. One method for achieving this type of junction is to grade the transition of the alloy ratio between the two segments over a distance of approximately one thousand angstroms. Other techniques are well known in the art.

The combination of the blocks 26A–26E, segments 28A–28E and segments 30A–30F comprises a structure 32 which is repeated with identical structures 34, 36, 38 and 40. Each of these structures is an elongated, segmented, electrically conductive member. The structures 32–40 are parallel and are spaced apart by a distance which is less than the wavelength of the incident infrared radiation of interest. A selected spacing is 8 microns.

The combination of the segments 30A–30F and 28A–28E comprises an elongate, segmented, electrically conductive member which serves to capture incident infrared radiation, transfer the energy of the radiation to the photosensitive segments 28A–28E wherein a detection signal is generated and electrically conveyed through the member. The plurality of detection signals generated by the multiple photosensitive segments 28A–28E are summed along the segmented, electrically conductive member.

The photosensitive segments 28A–28E, and the corresponding segments in the other structures, are preferably spaced apart from each other, in this embodiment, by less than the wavelength of the incident radiation. The reflecting plane 24 is spaced apart from the plane of the photosensitive segments 28A–28E by less than the wavelength of the incident radiation and preferably at one quarter wavelength from the photosensitive segments.

The segment 30A and the corresponding segments in the structures 34, 36, 38 and 40 are connected to a conducting member 42 which comprises the same material as the segment 30A and is preferably an extension thereof. A similar conducting member 44 is connected to segment 30F and the corresponding segments of the structures 34, 36, 38 and 40. A conductive connection pad 46, preferably an indium layer, is formed on the surface of the member 42 for providing electrical contact to the member 42. A similar pad 48 is provided on the member 44. The pads 46 and 48 are connected to a voltage bias, as described further below, and serve to collect detection signals which are generated within the structures 32–40.

When the material for the members 42 and 44 is n-type, indium is the preferable material for the pads 46 and 48. But if the material for the members 42 and 44 in p-type, gold is the preferred material for the pods 46 and 48.

Conductors 50, 52, 54, 56, 58 and 60 extend transverse to the structures 32–40 and are positioned immediately above respective segments 30A, 30B, 30C, 30D, 30E and 30F, and the corresponding segments within the structures 34–40. Each of the conductors 48–54 is electrically isolated from any other circuit element in the detector 20. These conductors are preferably aluminum having a width of 2 microns and a thickness of 0.1 microns. The center to center spacing is approximately 8 microns. These conductors extend throughout the entire array made up of a plurality of the detectors 20. These conductors function to couple a greater amount of the energy of the incident infrared radiation into the photosensitive segments, such as 28A–28E.

The detector 20 in FIG. 1 is shown with substantial open spaces between the blocks and segments of the various structures. However, most of the open volume shown in FIG. 1 below the plane of the conductors 50–60 is filled with a nonconductive material, such as zinc sulfide. This filler has been omitted from FIG. 1 to make possible a better view of the structure of the detector 20. The filler material is shown in FIGS. 3D–3K.

Further referring to FIG. 1, in operation, incident infrared radiation indicated by the arrows is received by the detector 20. The infrared radiation is incident to the top surface of detector 20 as shown in FIG. 1. The incident infrared radiation is substantially captured by the structural combination of the reflecting plane 24, the non-photosensitive segments and the photosensitive segments together with the conductors 50–60. The infrared energy is transferred to the photosensitive elements 28A–28E and corresponding elements, with the structure as a whole providing a substantial impedance match to that of the incident field. The purpose of the non-photosensitive elements 30A–30F is to enhance the impedance matching and to provide a continuous DC current path to extract the photogenerated signal current. The photo current detection signal produced by the photosensitive elements is extracted by the DC biased electrode pads 46 and 48.

The conductors 50–60 can extend across the top of the detector 20 and are preferably spaced 8 microns apart. These conductors extend across an array of the detectors 20, and serve to increase the collection of incident infrared radiation. Without the conductors 50–60 the detector 20 will collect approximately 50% of the incident infrared radiation in the wavelength band of 8–12 microns. But, with the inclusion of the conductors 50–60, the collection of incident radiation can be increased to approximately 70% across the band of interest. The conductors 50–60 reduce the polarization sensitivity of the detector 20. These percentages have been determined through computer simulations of the described structure.

The detector 20 is further shown in a section view in FIG. 2. This section view is taken along lines 2—2 in FIG. 1.

Figure 13:
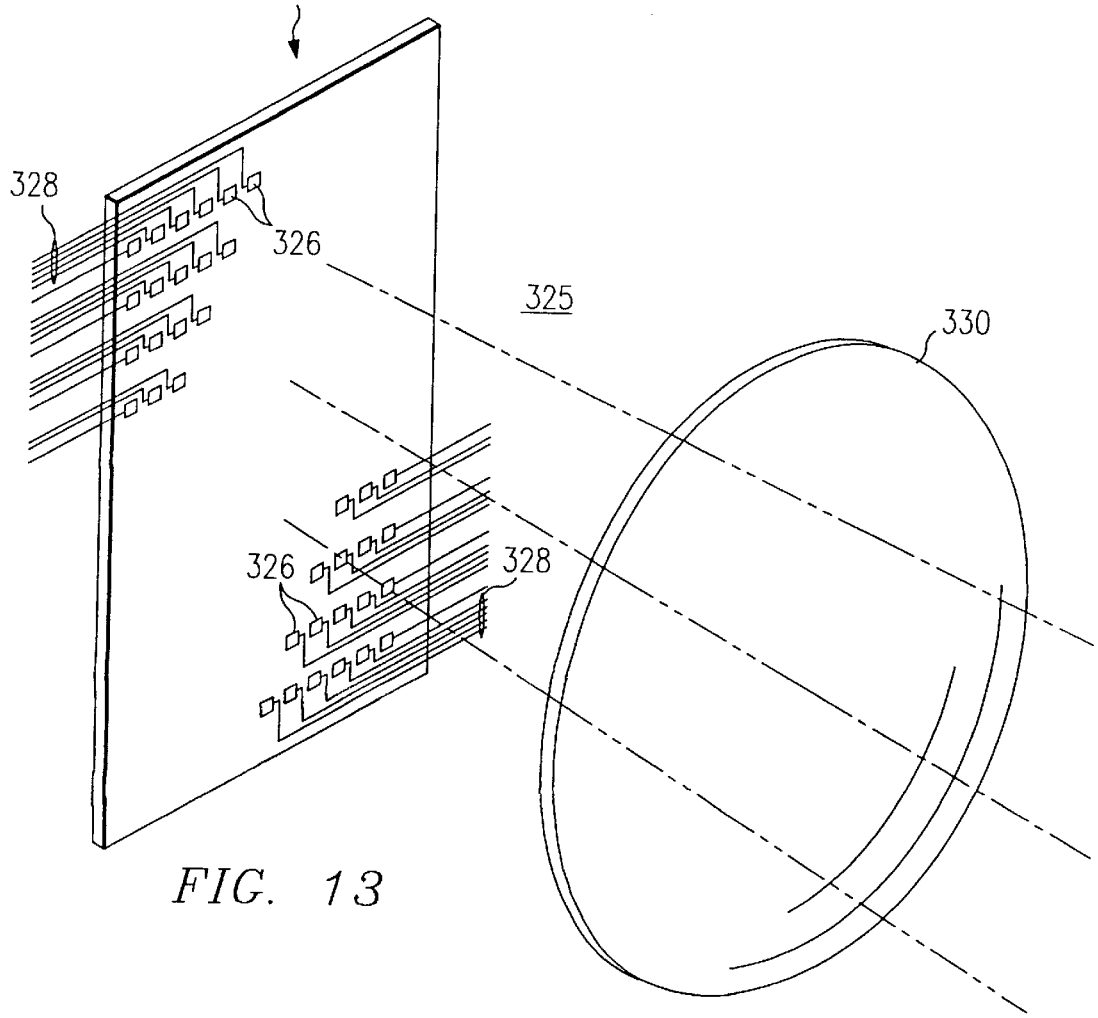
FIG. 13 is an illustration of an infrared imaging system having a detector array utilizing the detector elements in accordance with the present invention.

The detector 20 shown in FIGS. 1 and 2 can comprise a single pixel within an image. A two-dimensional array of detectors 20, as shown in FIG. 13, can be used to produce an infrared image.

Figures 3A, 3B:
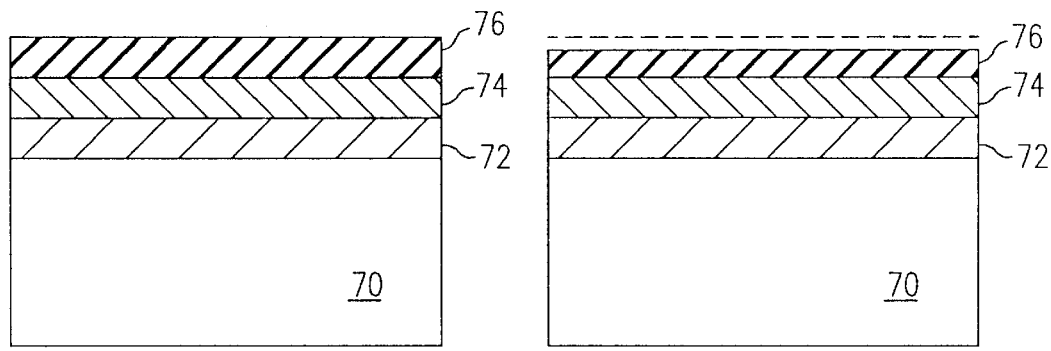
FIGS. 3A–3K illustrate steps in the process of making the detector illustrated in FIG. 1.

A sequence of steps for making the detector 20 is shown in FIGS. 3A–3K. As shown in FIG. 3A, there is provided a substrate 70, which is preferably cadmium zinc telluride having a crystal orientation of 2 degrees off <100>. The substrate 70 has a thickness of approximately 2 millimeters. On the surface of the substrate 70 there is grown a layer 72 of mercury cadmium telluride having an alloy ratio X=0.2 and a thickness of approximately 2.0 micron. On the surface of the layer 72 there is grown a layer 74 of mercury cadmium telluride having an alloy ratio X=0.15 with a thickness of approximately 0.5 micron. On the surface of the layer 74 there is provided a layer 76 of cadmium telluride. The layer 76 contains no mercury and therefore has an alloy ratio X=1.0. Layer 76 has a maximum preferred thickness of 1.0 micron. Each of these layers 72, 74 and 76 is preferably formed through a process of epitaxial growth using Metal-Organic Chemical Vapor Deposition (MOCVD) or Molecular Beam Epitaxy (MBE).

Referring to FIG. 3B, there is shown a step of precision thinning of CdTe layer 76 by either wet etching using dilute bromine methanol or by free methyl radical dry plasma etching. The preferred approach is dry plasma etching. The final thickness is determined by near infrared (0.8–2.5 micron) interference spectroscopy. The dry plasma etching can be carried out by use of a secondary afterglow reactor. In such a reactor there is a microwave discharge in a fluorine source gas. Methane is injected into the flowing afterglow to produce methyl radicals, which etch the cadmium telluride. Equipment for performing this process is provided by Plasma Quest, Inc. of Richardson, Tex.

Figures 3C, 3D:
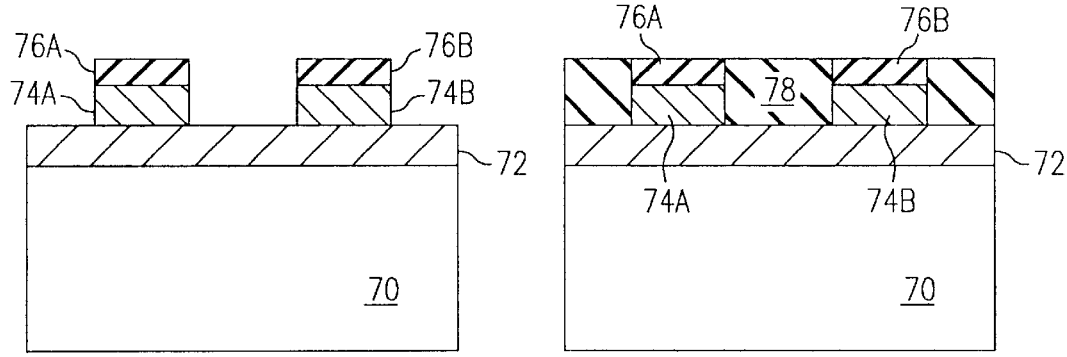

Referring to FIG. 3C, a photoresist is applied to the surface of layer 76 and by use of photolithography techniques, the layers 76 and 74 are etched to produce insulating blocks 76A and 76B and photosensitive segments 74A and 74B. A selected photoresist is AZ5214 and a selected etchant is free methyl radical. The insulating blocks 76A and 76B correspond to the insulating blocks 26A–26E shown in FIG. 1. Likewise, the photosensitive segments 74A–74B correspond to the photosensitive segments 28A–28E shown in FIG. 1.

Referring now to FIG. 3D, there is applied a zinc sulfide filler 78 which fills the open areas between the etched stacks comprising the blocks 76A–76B and segments 74A–74B. The filler 78 extends up to the surface of blocks 76A and 76B. The filler 78 is preferably applied by a process of electron beam evaporation.

Figure 3E:
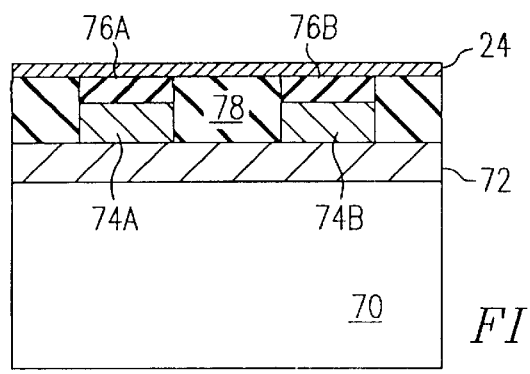

Referring now to FIG. 3E, the reflective plane 24 is applied by electron beam evaporation of aluminum on the top surface of filler 78 and the surface of the blocks 76A and 76B. The aluminum layer comprising plane 24 preferably has a thickness of approximately 500–1,000 angstroms. This plane is reflective to infrared radiation.

Figure 3F:
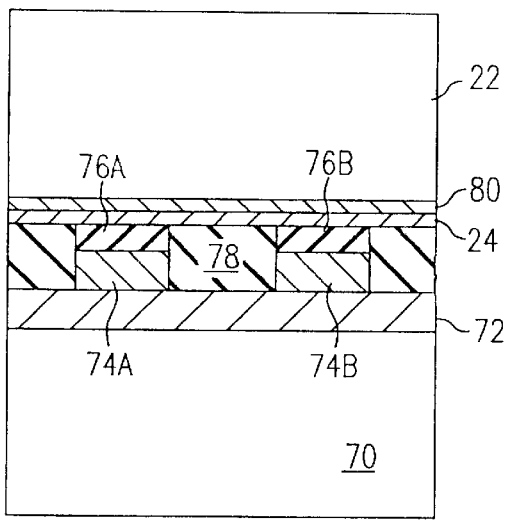

Referring to FIG. 3F, there is applied to the surface of the plane 24 an adhesive layer 80 which is preferably an epoxy, such as Epoxy Technology 301-2. The layer 80 has a thickness of approximately 0.5 micron. The epoxy layer 80 corresponds to the layer 23 shown in FIG. 1. A superstrate, which is the substrate 22 shown in FIG. 1, is applied to the epoxy adhesive layer 80 so that the superstrate, substrate 22, is bonded to the structure comprising the reflective plane 24, filler 78, blocks 76A, 76B, segments 74A, 74B, layer 72 and substrate 70.

Figure 3G:
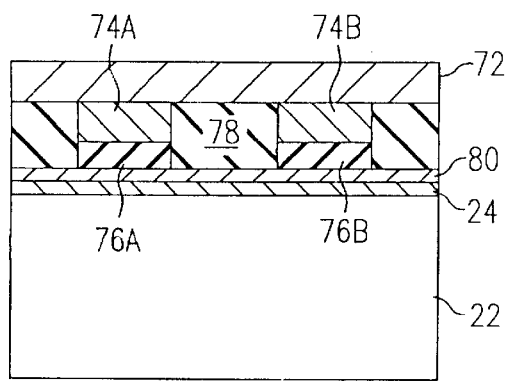

Referring now to FIG. 3G, there is shown a further step in the manufacturing operation for producing the detector 20. In the step shown in FIG. 3G, the substrate 70 has been removed, preferably by an etching process described below. The orientation of the device has been changed by a 180° rotation. This is done in FIG. 3G for the purpose of making the description of the process more understandable and to position the resulting device in the same orientation as detector 20 shown in FIG. 1.

Substrate 70 can be removed by any one of a number of techniques including lapping or etching. A preferred technique is etching by use of a technique described in an article entitled "Selective Etching of CdTe and ZnCdTe Substrate from HgCdTe Epilayers" by G. M. Metze, D. L. Spears and N. P. Walsh of Lincoln Laboratory, MIT, published in the Proceedings of the 1985 Meeting of the IRIS Specialty Group on Infrared Detectors, held on Aug. 6–8, 1995 in Vol. 2, pp 123–132 and dated Aug. 7, 1985. This process is described on the following page.

(U) As suggested above, it is necessary that the (Zn)CdTe substrate (with a greater than 20:1 Cd to Zn ratio), be removed from the sensor structure without any substantial removal of, or damage to, the adjacent HgCdTe layer 72. This may be accomplished by several means, such as lapping away the substrate 70, etching, or other processes. Selective etching is preferred, but in the past conventional etching procedures have not been sufficiently selective and tend to dissolve, and create pits and roughness in the surface of the HgCdTe layer 72. Such etches have contained either bromine or aqua regia, which tend also to attack the HgCdTe. A preferred, highly selective etching process will now be described.

(S) The preferred etching process utilizes what is known in the art as an "E"etch, e.g., an etch comprised of $HNO_3$; $H_2O$; $K_2Cr_2O_7$, as reported by M. Inone, I. Teramoto and S. Takayanaki in an article entitle "Etch Pits and Polarity in CdTe Crystals" (U), Journal of Applied Physics 33, 2578 (1962).

(S) Such an etching process, applied as discussed below, entails an etch ratio of 10,000;1 between (Zn)CdTe and HgCdTe. A base ratio of the materials is: 20 ml $HNO_3$; 40 ml $H_2O$: 8 g $K_2Cr_2O_7$. It has been observed that increasing the amount of $K_2Cr_2O_7$ somewhat increases the etch rate, but a point of saturation is reached at which the solution attacks other materials which may be present, such as epoxy or the like. If it is desired to minimize etching of epoxy masks, or the like, the solution is preferably diluted with water to a level at which it provides an adequate etch rate, yet is sufficiently mild not to attack epoxy or the HgCdTe. Such a solution comprises 20 ml of $HNO_3$; 400 ml of $H_2O$; and 8 gms of $K_2Cr_2O_7$.

(S) An appropriate etching temperature is 22° C. Etching rates may be increased by raising the etch temperature, e.g., to 60° C. but at such elevated temperatures the etched surface becomes rough and blackened. Mild stirring of the solution increases the etch rate by about 50%.

(S) It is believed that the dissolution of the (Zn)CdTe material with a greater than 20:1 Cd to Zn ratio incorporates both: (1) the preferential etching of Cd, which is activation-limited; and (2) the oxidation and dissolution of Te/TeO$_2$, which is diffusion-limited.

(S) In use, the sensor structure is inverted over the etching solution and supported with the (Zn)CdTe substrate immersed in the etch. The required etch time will, of course, depend upon the thickness of the particular substrate and may be determined most readily by emperical observations. Typically, however, etch times of 2 microns per minute (using the diluted etch) have been observed. Because of the substantial etch rate ratio, however, timing is not critical, and the sensor may be left safely in the solution for a sufficiently long time to insure the (Zn)CdTe substrate removal.

Figure 3H:
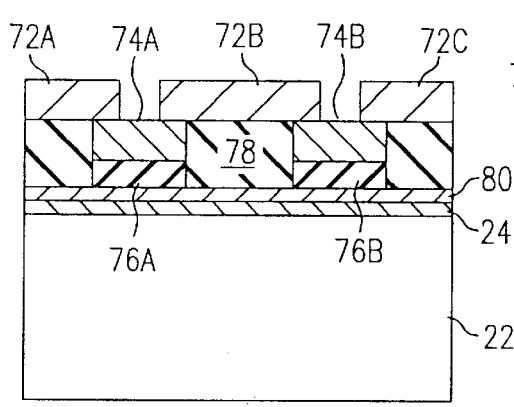

In FIG. 3H, the layer 72 is etched by photolithographic processes to form bridging segments 72A, 72B and 72C. A selected photoresist is AZ5214 and a selected etchant is free methyl radical, as noted above. These segments correspond to the nonphotosensitive segments 30A–30F shown in FIG. 1.

Figure 3I:
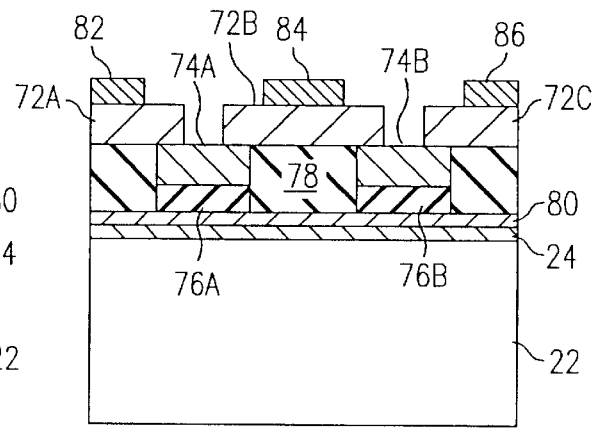

Referring to FIG. 3I, there is shown the step of depositing aluminum conductors 82, 84 and 86 which correspond to the conductors 50–60. This is done by use of conventional aluminum electron beam evaporation and photolithography. In addition, there are formed conductors which correspond to pads 46 and 48 in a subsequent step.

Figure 3J:
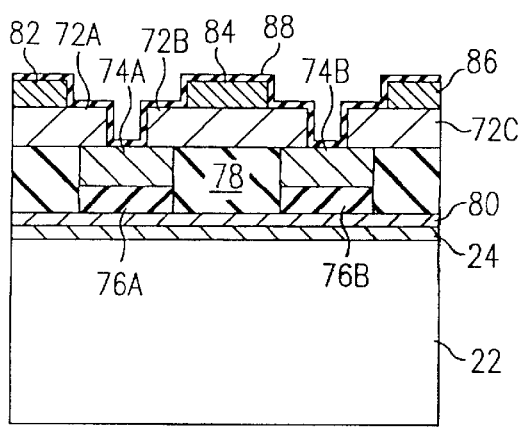

Referring now to FIG. 3J, a passivating layer 88 is applied over the surface of the conductors 82–86, the exposed surfaces of the segments 72A, 72B and 72C as well as the exposed surfaces of the segments 74A and 74B. Thus, the entirety of the exposed surface of the device is covered with the passivating layer 88. The layer 88 is preferably zinc sulfide having a thickness of approximately 0.1 micron.

Figure 3K:
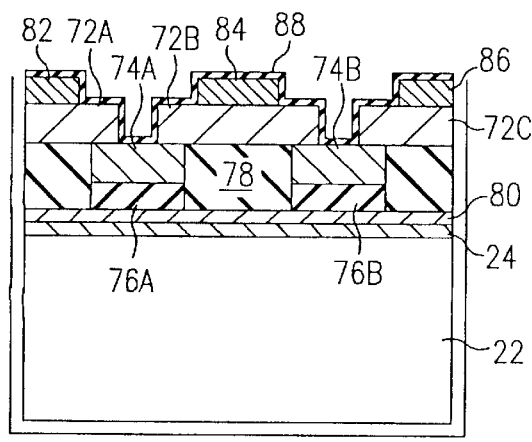

Referring now to FIG. 3K, there is shown symbolically the step of attaching leads to the appropriate surface conductors of the device followed by packaging of the device. This step represents conventional lead attachment and packaging for semiconductor devices.

The infrared absorption characteristics for the photosensitive and non-photosensitive segments illustrated in FIGS. 1–3 are shown in FIG. 4. The term "photosensitive" is relative to the infrared band of interest. The chart in FIG. 4 shows the infrared radiation absorption characteristics for mercury cadmium telluride (MCT). Curve 87 illustrates the absorption characteristics for MCT having alloy ratio of approximately X=0.2. Note that with this ratio the MCT is absorptive for infrared radiation over essentially the range of 4–8 microns. Curve 89 illustrates the absorption of MCT having X=0.15. Note that the MCT with this ratio has high absorption over the range of 8–12 microns. Thus, MCT having X=0.2 is substantially not photosensitive over the 8–12 micron range. These absorption curves are for MCT at room temperature. Curve 87 corresponds to the non-photosensitive segments 30A–30F. The curve 89 represents the photosensitive characteristic of segments 28A–28E.

Referring to FIG. 5, there is shown an infrared absorption curve 91 which represents the overall infrared absorption of the device 20 shown in FIGS. 1 and 2. As shown, this device has a very high percentage of absorption in the 8–12 micron range. It is this range of wavelengths that are of principle interest for thermal imaging. This absorption curve has been determined by computer modeling.

Figure 6:
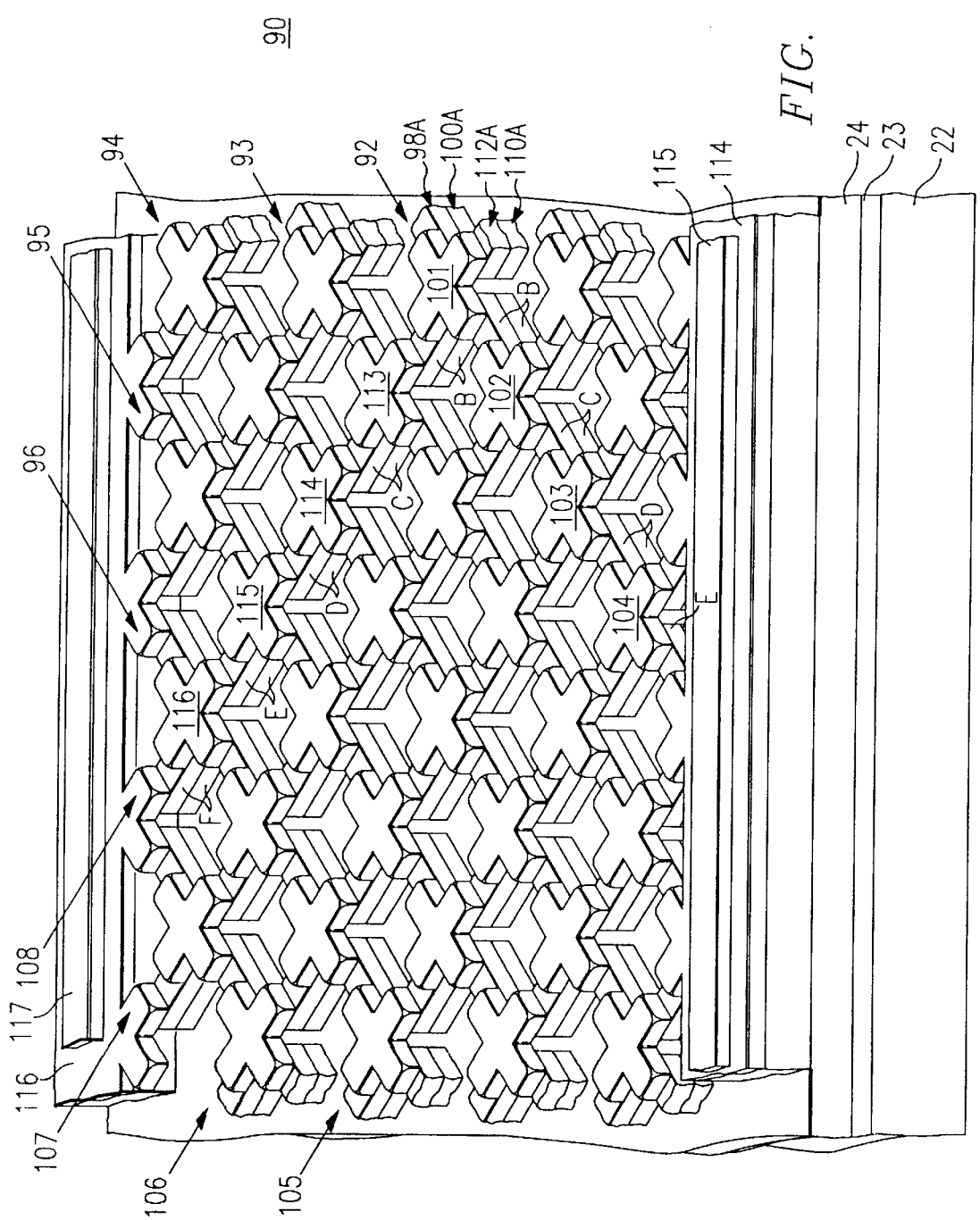
FIG. 6 is a perspective view of a nonpolarized infrared radiation detector in accordance with the present invention.

A further detector embodiment of the present invention is a radiation detector 90 shown in FIG. 6. Detector 90 is a nonpolarized embodiment of the detector 20 shown in FIG. 1. The detector 90 has similar base structures 22, 23 and 24. However, the elongate conductors 50–60 are not required because the detector 90 is not polarization sensitive. The detector 90 collects both horizontally and vertically polarized infrared radiation. The detector 90 has a plurality of elongate structures 92, 93, 94, 95 and 96. Structure 92 will be described in detail as representative of the other structures. The structure 92 includes insulating blocks 98A, 98B, 98C, 98D and 98E. These correspond to the blocks 26A–26E shown in FIG. 1.

On the surface of the blocks 98A–98E there are provided similarly shaped photosensitive segments 100A, 100B, 100C, 100D, and 100E. These correspond to the photosensitive segments 28A–28E shown in FIG. 1.

The detector 90 further includes X-shaped nonphotosensitive bridging segments 101, 102, 103 and 104. These comprise the same material as the segments 30A–30E shown in FIG. 1. The segment 101 bridges across the segments 100A and 100B. The segments 102, 103 and 104 likewise bridge across corresponding photoconductive segments.

Transverse to the structures 92–96, there are provided structures 105, 106, 107 and 108. Structure 108 will be described in detail as representative of the remaining parallel structures 105–107. Structure 108 includes insulating blocks 110A, 110B, 110C, 100D, 110E and 110F. These correspond in size and material to the blocks 26A–26E shown in FIG. 1.

On the surface of the blocks 110A–110F there are corresponding photosensitive segments 112A, 112B, 112C, 112D, 112E and 112F. These correspond in size and material to the photosensitive segments 28A–28E shown in FIG. 1.

The nonphotosensitive bridging segment 101 likewise bridges across photosensitive segments 112A and 112B. Corresponding bridging segments 113, 114, 115 and 116 in structure 108 bridge across corresponding elements 112B–112F.

The fabrication of the detector 90 is virtually the same as that described for the detector 20 but with appropriately altered masks to produce the additional elements and altered shapes.

The detector 90 further includes conducting members 114 and 116. Member 114 comprises the same material as the bridging structures, such as 101–104 and is an extension of these members at the edge of the detector 90. On the surface of the member 114 there is provided a connecting pad 115, which is preferably an indium contact. The conducting member 116 corresponds to the member 114 and has a similar conducting pad 117 thereon. The members 114 and 116 are supported by respective insulating member 118 and 119. The DC bias for the detector 90 is applied between the pads 115 and 117 and the detected signal is likewise produced therefrom.

The detector 90 operates in the same manner as described above for the detector 20 but has enhanced performance due to the collection of transverse polarized incident radiation. This eliminates the need for the conductors 50–60 shown in FIG. 1.

Figure 9:
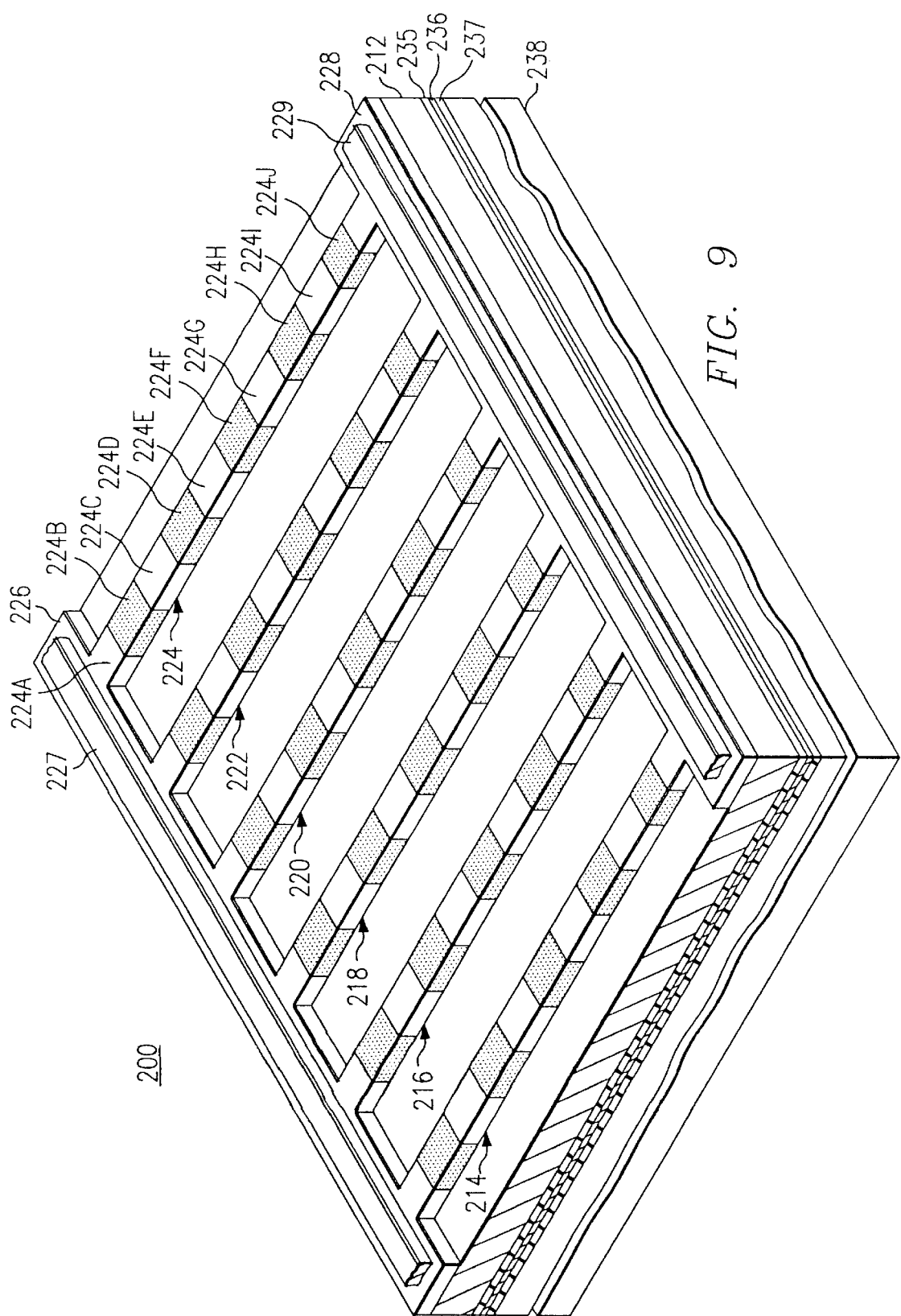
FIG. 9 is a perspective view of the infrared detector shown in FIGS. 7 and 8.

A still further radiation detector 200 in accordance with the present invention is illustrated in FIGS. 7, 8 and 9. Detector 200 is likewise designed to capture infrared radiation in the wavelength range of 8 to 12 microns. Elements of the detector 200 are fabricated on a dielectric substrate 212 which is, for example, cadmium telluride just as for the substrate 22 shown in FIG. 1. A plurality of electrically conductive, segmented, elongate members 214, 216, 218, 220, 222, and 224 are fabricated on the surface of the substrate 212. A representative size for each of these members is a width of 1.0 micron, a thickness of 0.5 micron, and a length of 5.0 microns.

At the opposite ends of the members 214–220, there are provided electrically conductive end members 226 and 228 which connect the ends of the members 214–224 in parallel. The members 226 and 228 are preferably the same material as the nonphotosensitive, but conductive, segments such as 30A–30F shown in FIG. 1. Each of the members 226 and 228 preferably has a width of approximately 2–5 microns and a thickness of approximately 0.5 micron. Member 226 has a conducting pad 227, preferably an indium contact on the surface thereof. Member 228 similarly has a conducting pad 229 thereon.

Each of the members 214–224 has a plurality of segments along its length. A preferred material for these elongate members is mercury cadmium telluride. The photosensitive characteristics of this material are determined by the ratios of the mercury and cadmium elements. Each of the members 214–224 comprises mercury cadmium telluride but alternating segments have different alloy ratios which change the photosensitive nature of the segments with respect to the wavelength of the incident radiation. In this embodiment, each photosensitive segment has a length of approximately 3 microns and each nonphotosensitive segment has a length of approximately 5 microns.

Member 224 is described in detail as representative of all the members 214–224. Member 224 comprises segments 224A–224K connected in series. Segment 224A is electrically connected to the conductive member 226. Segment 224K is likewise connected to the electrically conductive member 228.

Each of the members 214–224 is made of mercury cadmium telluride, but the alloy ratio of the segments is different. For room temperature operation, segments 224A, 224C, 224E, 224G, and 224I have X greater than or preferably equal to 0.2, which is high enough to make the material transparent to infrared radiation over the wavelength band of interest, that is, 8–12 microns. For the segments 224B, 224D, 224F, 224H and 224J, the value of the alloy ratio of X is approximately 0.15 to make the material absorbing, that is, photosensitive, over the 8–12 micron wavelength band. As a result, the segments 224B, 224D, 224F, 224H and 224J are photosensitive, while the remaining segments are not photosensitive over the wavelength band of interest. It can therefore been seen that the segments 224A, 224C, 224E, 224G, 224I and 224K correspond to the nonphotoconductive segments 30A–30F shown in FIG. 1. Likewise, the composition of the segments 224B, 224D, 224F, 224H and 224J correspond to the photosensitive segments 28A–28E shown in FIG. 1.

The detector 200 is illustrated in a section view in FIG. 8. A reflecting plane or layer 236, preferably a layer of aluminum having a thickness of approximately 500–1,000 angstroms, is offset from the members 214–224 by a distance of less than 0.5 micron, which is less than the wavelength of the radiation of interest. A layer 235 of zinc sulfide is located between the layer 236 and the substrate 212. The preferred offset spacing is one quarter of the optical wavelength for the radiation at the center of the band of interest. The radiation wavelength within the detector material is substantially shorter than in free space.

An additional substrate section 238 may be provided below the reflecting layer 236 to enhance structural integrity. The substrate 238 material can be the same as that of substrate 212. The reflecting plane may optionally be a dielectric discontinuity between the substrates 212 and 238, which discontinuity serves to reflect infrared radiation. Such a discontinuity can be provided by the adjacent substrate layers having different dielectric indices. In such a configuration, the aluminum layer would not be needed.

In reference to FIGS. 7–9, a selected thickness for the members 214–224 is 0.5 microns. A selected thickness for the lower substrate 238 is 2 millimeters.

Operation of the detector 200 in accordance with the present invention is now described in reference to FIGS. 7–9. Infrared radiation is directed through a lens (shown in FIG. 13) to the surface of the detector 200. The objective of the present invention is to capture a very high percentage of the incident radiation and transfer the energy of the radiation to the photosensitive detector elements. These include the photosensitive segments such as segments 224B, 224D, etc. which produce a detection signal that is proportional to the amplitude of the incident radiation. Infrared radiation, for the preferred example, is captured by the combination of the structure comprising the reflective layer 236 and the structure of the elongate members 214–224 which comprise both non-photosensitive and photosensitive segments.

The photosensitive segments 28A–28E (FIG. 1) and segments 224B, 224D, 224F, 224H and 224J (FIG. 6) have the following physical properties:

1. Non-zero conductivity, i.e., conduct DC current.
2. Infrared radiation conductivity is finite, not zero.
3. Dielectric with preferred index n=3.6–3.8.
4. Alloy ratio X is preferably 0.15 at room temperature.
5. Non-zero infrared radiation absorption.

The non-photosensitive segments 30A–30F (FIG. 1) and the segments 224A, 224C, 224E, 224G, 224I and 224K have the following physical properties:

1. Non-zero conductivity, i.e., conduct DC current.
2. Infrared radiation conductivity is zero.
3. Alloy ratio x is preferably greater than 0.2 at room temperature.
4. A dielectric having a preferred constant of n=3.6
5. No infrared absorption.

Figure 10:
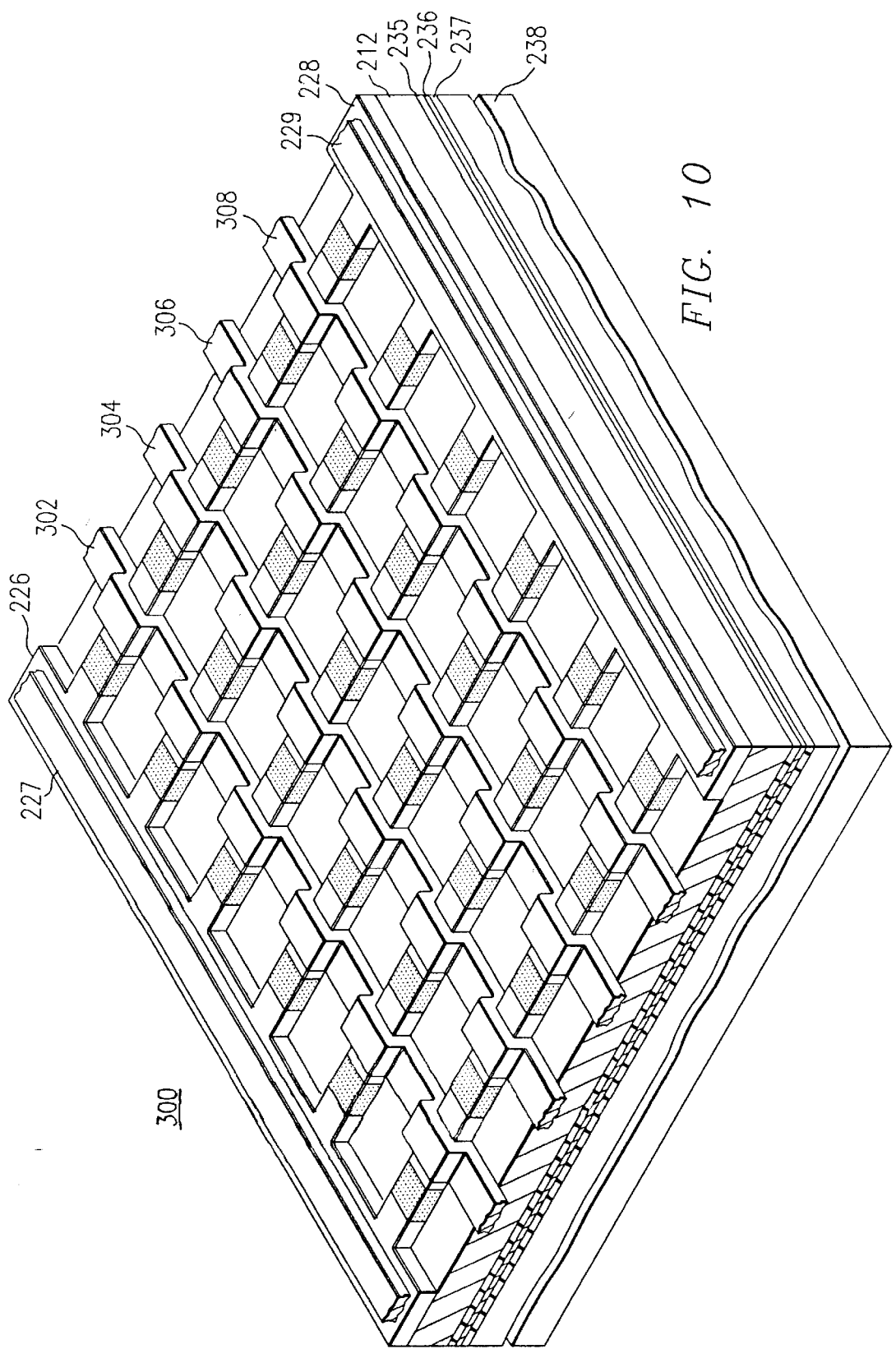
FIG. 10 is a perspective view of an alternative embodiment of the present invention.

A still further embodiment of the present invention is illustrated in FIG. 10. A detector 300 has a structure as shown in FIG. 9 with the addition of conductive lines 302, 304, 306 and 308. The remaining structural elements are the same as those shown in FIG. 9 and are notated by the same reference numerals. The conductive lines 302, 304, 306 and 308 are preferably aluminum and extend transversely across the elongate members 214–224. The aluminum conductive lines 302–308 are each independent and are not electrically connected to each other or to any other element of the detector 300. The lines 202–208 serve the function of enhancing the collection of radiation by the detector 300, just like the conductors 50–60 shown in FIG. 1.

For detectors 200 and 300, a DC bias signal is applied between the electrically conductive member 226 and 228. The photosensitive detector segments produce charge carriers and therefore change impedance upon receipt of the infrared radiation energy. These impedance changes modify the applied bias signal. Amplitude changes in the bias signal comprise the detected signal.

For detector 300, the capture structure also includes the collection of conductive lines which includes lines 302–308. This structural combination can capture a very high percentage of the overall incident radiation in a given band. A graph of the capture of such radiation for the detector 300 is shown in FIG. 5 as projected by theoretical modeling. The intercept percentage approaches 100% for the design wavelength.

Figure 11A:
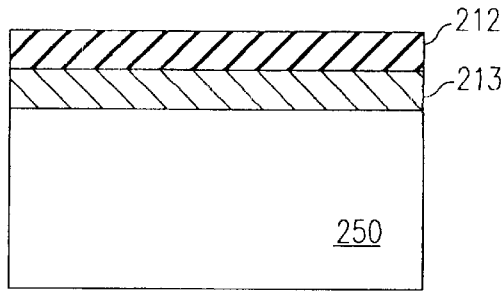

The process for making the detectors 200 and 300 is shown in FIGS. 11A–11L. Referring to FIG. 11A, there is shown a substrate 250 which is preferably cadmium telluride having a thickness of 2 millimeters. A mercury cadmium telluride layer 213 is grown by the process of MOCVD or MBE on the surface of the substrate 250. A layer 212 of cadmium telluride is grown on the surface of the layer 213. The layer 213 has a preferable thickness of 2 microns and the layer 212 has a preferable thickness of 0.5 micron.

Figure 11B:
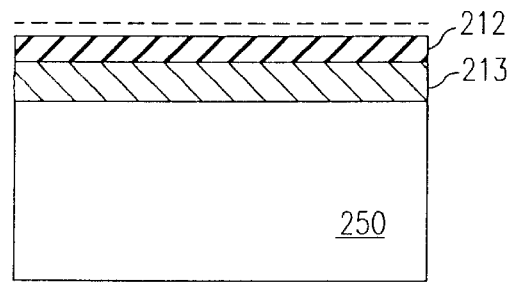

Referring now to FIG. 11B, the cadmium telluride layer 212 is thinned by any one of several processes. The material comprising layer 212 may be thinned by wet etching or dry etching. The wet etching can be done with dilute bromine methanol. The dry etching can be carried out by use of free methyl radicals, as described above in reference to FIG. 3B. The wet etching is typically faster in removing material but the dry etching can be controlled for a more precise etching of the layer 212. The desired thickness of layer 212 is approximately 0.3 microns. This can be measured by use of near infrared (0.8–2.5 microns) interference spectroscopy. The layer 212 is precisely thinnind to adjust the distance between the photosensitive elements and the refelecting plane.

Figure 11C:
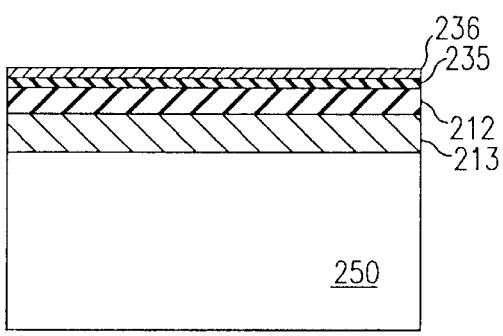

Referring to FIG. 11C, an insulating layer 235 of zinc sulfide is deposited on the surface of the thinned cadmium telluride layer 212. A layer 236 of aluminum serving as a reflective mirror, is deposited on the surface of the zinc sulfide layer 235. The preferred thickness of the zinc sulfide layer 235 is 0.1 micron and the preferred thickness of the aluminum layer 236 is 500–1,000 angstroms. The zinc sulfide layer serves as an additional insulator to prevent the leakage of any currents from the photosensitive segments and conductors into the substrate. If the cadmium telluride layer 212 is of a sufficiently pure quality, it is a very good insulator and the supplemental layer 235 of zinc sulfide is therefore not required.

Figure 11D:
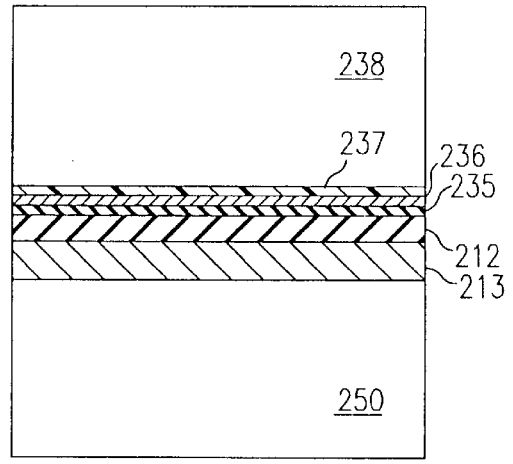

Referring to FIG. 11D, a superstructure which comprises the substrate 238, is bonded by use of an epoxy layer 237 to the surface of the aluminum layer 236.

Figure 11E:
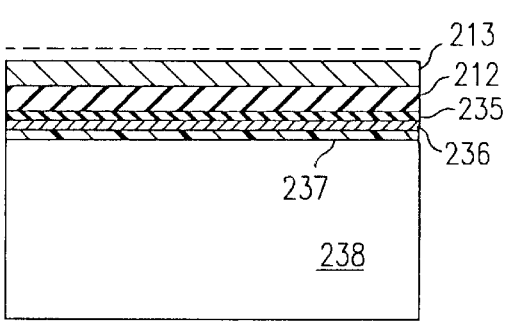

Referring to FIG. 11E, the substrate 250 is removed from the overall structure by one of several possible processes. This is the same as described above for the removal of substrate 70 in reference to FIGS. 3F and 3G. As noted therein, the layer 70 can be removed by mechanical lapping or etching by use of the described processes. In FIG. 11E, the structure is rotated 180° to enhance the description of the subsequent steps and correspond to the orientation of the illustrated detectors 200 and 300.

In FIG. 11E, the layer 213 is thinned to a desired thickness of approximately 0.5 microns. The material can be removed by use of any one of several processes including mechanical lapping and etching, either wet or dry. A selected wet etchant is dilute bromine methanol. Dry etching can be carried out as described above for layer 76 in FIG. 3B. The thickness of the layer 213 can be measured by the use of infrared interference spectroscopy.

Figure 11F:
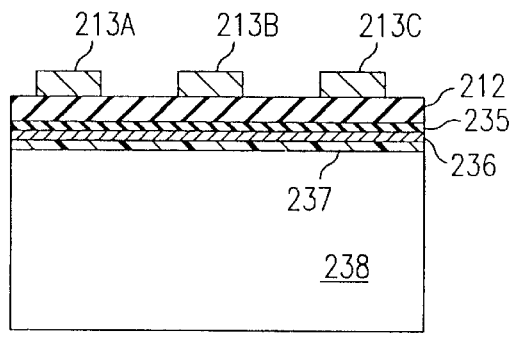

Referring to FIG. 11F, the layer 213 is etched in a photolithographic process utilizing AZ5214 as a selected photoresist and free methyl radicals as a etchant. This process produces a plurality of photosensitive segments 213A, 213B and 213C. These correspond to the photosensitive segments 224B, 224D, etc. shown in FIG. 9. A perspective view of the structure produced in the step shown in FIG. 11F is illustrated in FIG. 11G.

Referring to FIG. 11H, a layer of mercury cadmium telluride 240 having an alloy ratio X=0.2 is grown by MOCVD or MBE on the surface of the structure. The layer 240 covers the surface of the layer 212 as well as the detector segments 213A, 213B and 213C.

Referring to FIG. 11I, the layer 240 is patterned and etched by photolithographic techniques to remove the material of layer 240 which is positioned between the previously formed rows of photosensitive segments, such as a row comprising segments 213A, 213B and 213C. The photosensitive segments are indicated between the dashed lines.

Referring to FIG. 11J, the layer 240 is further etched where it directly covers the previously formed photosensitive segments, such as 213A, 213B and 213C. The remaining intermediate material comprises nonphotosensitive, conductive segments 240A and 240B.

A top view of the structure shown in FIG. 11J is illustrated in FIG. 11K. There are now formed continuous strips which comprise alternate segments that are photosensitive with other segments that are conductive but non-photosensitive for the wavelength of infrared radiation of interest.

Referring to FIG. 11L, there are shown the steps of adding a passivating layer 242 on a surface of the structure. This layer is preferably a material such as zinc sulfide. Finally, contacts are formed to the appropriate conductive portion of the detector as shown, for example, a contact 244. Such contacts are preferably made of indium. Finally, the overall device has lead attachment and is packaged in a conventional manner. If an individual detector is required, an IR window is provided in the package. In a focal plane array, a plurality of devices are provided in an evacuated environment where they receive an infrared image.

Figure 12:
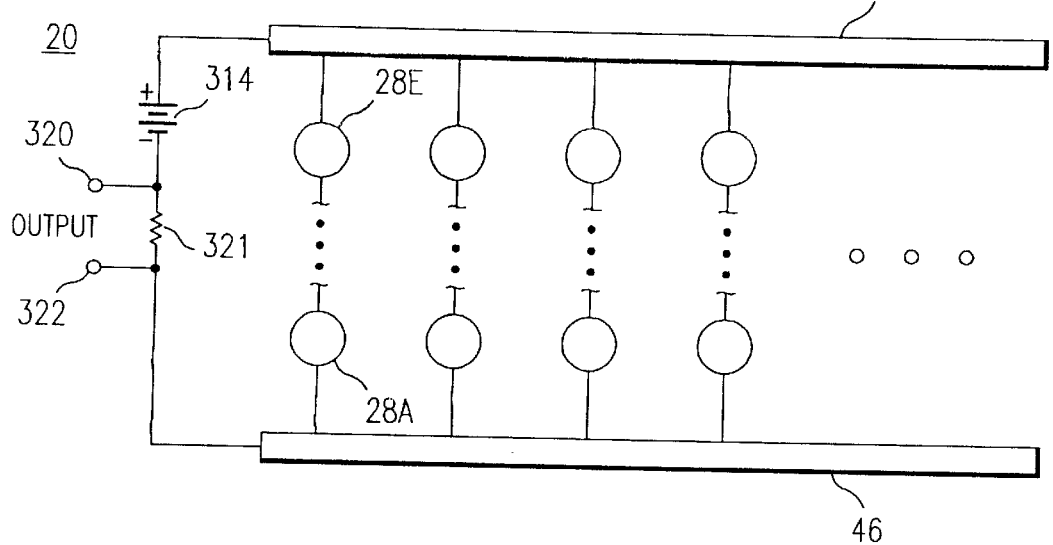
FIG. 12 is an electrical schematic of a detector in accordance with the present invention.

A schematic circuit illustration of the operation of the detector 20, and similarly detectors 90, 200 and 300, is shown in FIG. 12. In FIG. 12, the detector segments, the photosensitive segments in the infrared detectors, are represented as signal sources such as 28A–28E which are connected between the conductive pads 46 and 48 (FIG. 1). A bias signal is applied by a DC source 314 which is connected in series with a load resistor 321 between the conductive pads 46 and 48. When the detectors, which include the segments 28A and 28E receive the energy of the captured infrared radiation, this energy is translated into an impedance variation that alters the amplitude of the DC bias signal and produces a detection signal between output terminals 320 and 322. This is the output signal for a single pixel element in an array of such circuits.

A detector array 324 is illustrated in FIG. 13. The array 324 comprises a plurality of single pixel detectors, as represented by detectors 326. The detectors 326 can be any of the detectors 20, 90, 200 or 300 as shown in FIGS. 1, 6, 7, 9 and 10. All of the detectors within the array 324 can have a common bias line but each must have a separate output signal line, with lines 328 for the detector 326. All of the pixel detectors within the array 324 have separate signal lines.

The array 324 is a part of an infrared imaging system 325. The collection of all of the pixel detectors within the array 324 can produce an image as a result of the focusing of infrared radiation onto the surface of the array 324 by a lens 330. The image is in the signal at the output signal lines, such as 328. Further, all of the individual pixel detectors, such as 326, may be fabricated on a single, common substrate, such as substrate 22 shown in FIG. 1.

Figure 14:
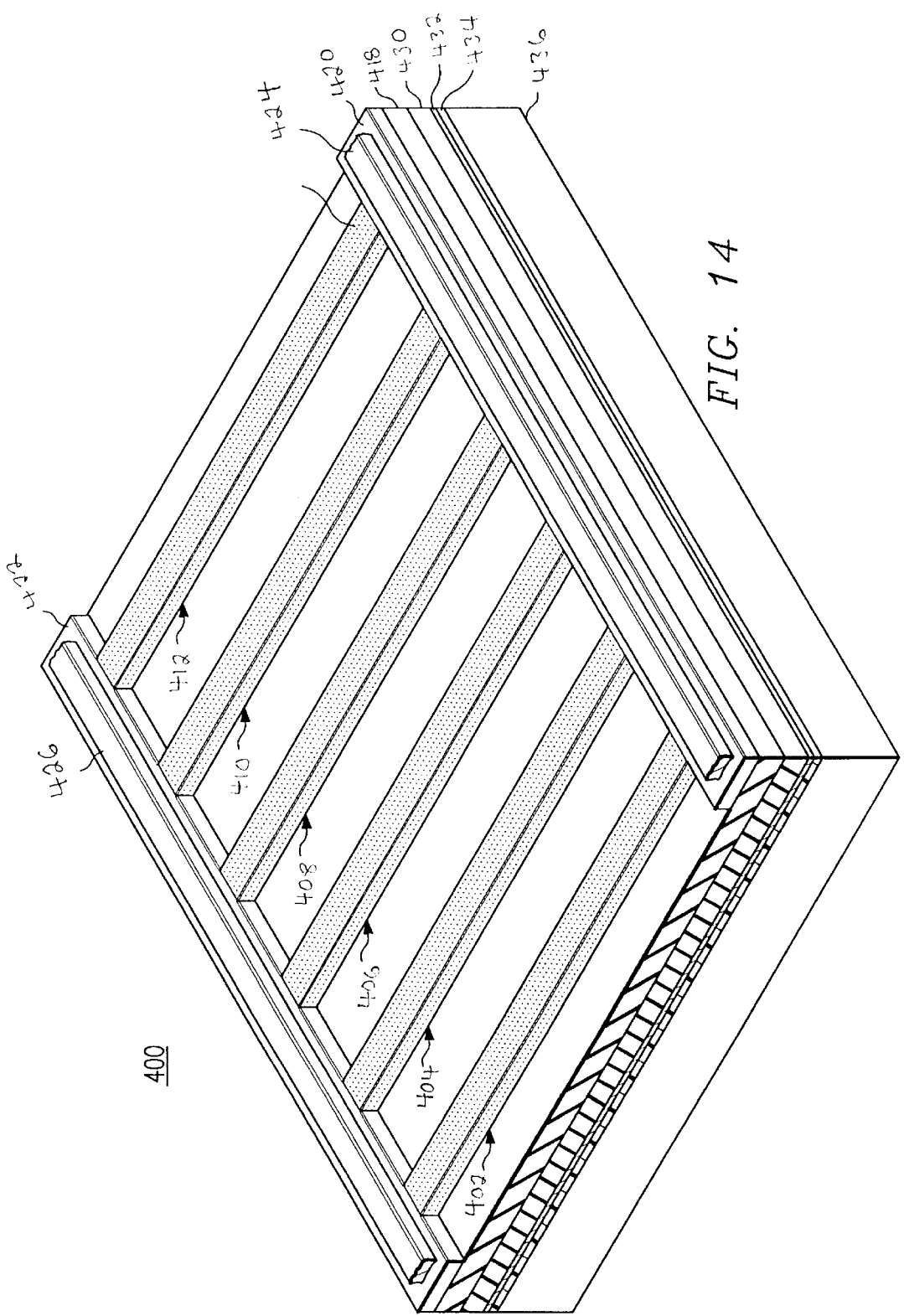
FIG. 14 is a perspective view of an infrared detector having strips of photosensitive material disposed between parallel conductors.

Referring to FIG. 14, there is illustrated an infrared detector 400 which has a plurality of photosensitive strips 402, 404, 406, 408, 410 and 412 positioned on a substrate layer 418. The strips 402–412 comprise mercury cadmium telluride (MCT) having an x ratio of approximately 0.15, corresponding to an operating temperature of 300° K. The layer 418 is preferably cadmium telluride.

The strips 402–412 have a thickness of approximately 0.5 micron, a width of 1 microns and a length of 50 microns. The layer 418 is preferably approximately 0.3 microns thick.

At opposite ends of the strips 402–412 are conductive members 420 and 422 which are preferably mercury cadmium telluride having an x alloy ratio equal to or greater than 0.2. With this ratio the members 420 and 422 are electrically conductive but not photosensitive, in the 8–12 micron band at 300° K. Indium contacts 424 and 426 are positioned respectively above the conductive members 420 and 422 and are in ohmic contact with members 420 and 422.

The layer 418 is positioned on a layer 430 which comprises zinc sulfide having a thickness of approximately 0.2 micron.

An aluminum layer 432 is bonded between layer 430 and an epoxy bonding layer 434. Layer 432 is an infrared reflecting plane and has a thickness of approximately 500–1,000 angstroms.

A substrate 436, preferably sapphire, has a thickness of approximately 2 millimeters. The epoxy layer 434 bonds the aluminum layer 432 to the substrate 436.

Figure 15A:
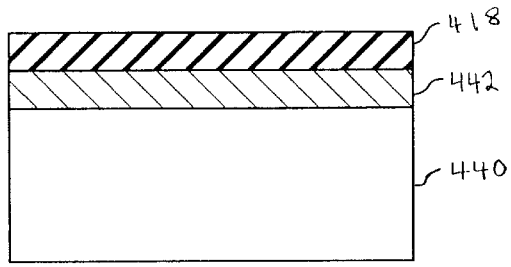
FIGS. 15A–15H illustrate steps in the process of making the detector illustrated in FIG. 14.

Referring to FIGS. 15A–15H, there is shown a process for making the detector 400 shown in FIG. 14. This is very much like the fabrication process described in FIGS. 3A–3K. In FIG. 15A, a layer 442 of mercury cadmium telluride having x=0.15 is grown on the surface of a dielectric plate 440 of cadmium zinc telluride. The layer 440 will be etched, as described below, to become the strips 402–412. A layer 418 of cadmium telluride is grown on the surface of layer 442.

Figure 15B:
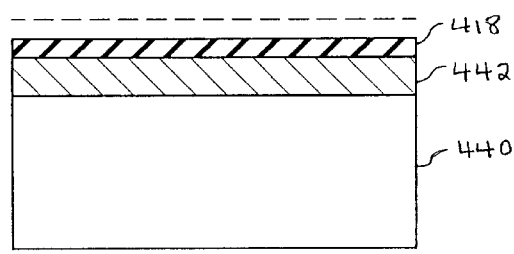

In FIG. 15B the layer 418 is thinned in the same manner as described above for layer 76 in FIG. 3B.

Figure 15C:
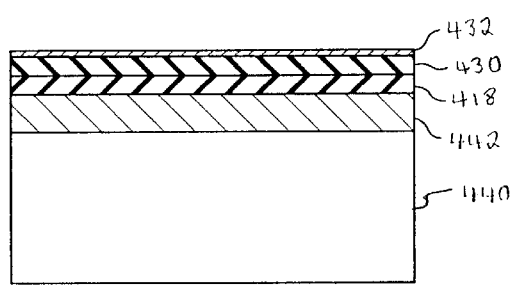

Referring to FIG. 15C there is grown the layer 430 on the surface of layer 418. The aluminum layer 432 is formed on the surface of layer 430 as described above for plane 24 shown in FIG. 3E.

Figure 15D:
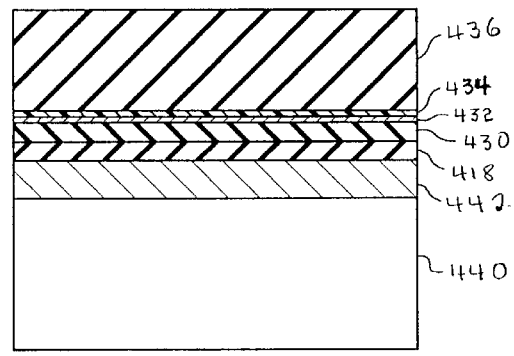

In FIG. 15D an epoxy layer 434 is applied to the exposed surface of the aluminum layer 432 for bonding substrate 436 to the remainder of the structure.

Figure 15E:
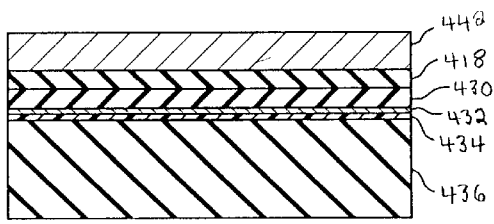

Referring to FIG. 15E, the plate 440 has been removed in the same manner as the substrate 70 shown in FIG. 3F. The structure has been inverted in FIG. 15E from that shown in FIG. 15D.

Figure 15F:
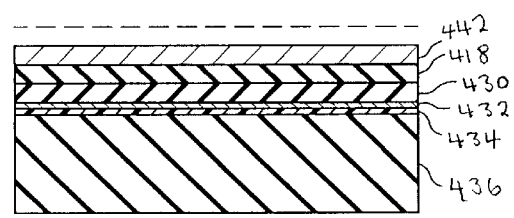

The layer 442 is thinned, as shown in FIG. 15F, by a process of wet etch using bronine methynol or a dry etch as described above in reference to FIG. 3B to gain the desired thickness for the strips 402–412.

Figure 15G:
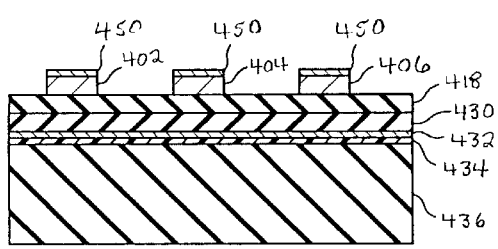

In FIG. 15G, a resist 450, as described above, is applied to the layer 442 and patterned for selectively etching layer 442 to produce the strips 402–412. The resist 450 is then removed.

Figure 15H:
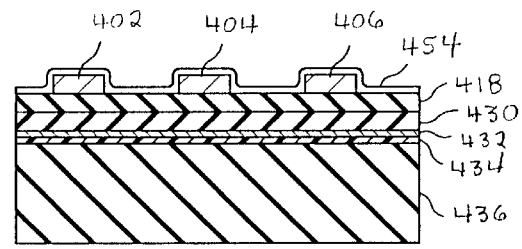

In FIG. 15H a passivating layer 454 is applied on the exposed surface of the detector structure for protection. The detector is completed by conventional processes steps of aluminum deposition, lead attachment and packaging.

The detector 400, shown in FIG. 14, in comparison to the detector 200 shown in FIG. 9, may have lesser detectivity than detector 200 for similar size and geometry; but can be more easily fabricated due to lesser complexity and fewer manufacturing steps. Otherwise, the functionability is essentially the same.

Infrared detectors fabricated as described herein have substantially increased detectivity over prior designs. This increased detectivity can be traded off to reduce the need for cooling equipment, while maintaining standard sensitivity, or using cooling equipment and having a detector with substantially enhanced sensitivity.

The photosensitive segments described herein for the disclosed embodiments are fabricated of mercury-cadmium-telluride having a specified alloy ratio. This material is photoconductive, that is, a bandgap material which produces charge carriers in response to incident radiation. The photosensitive segments may also be made of a photovoltaic structure, such as a mercury-cadmium-telluride p-n junction, which produces a voltage in response to the incident radiation.

In summary, the present invention comprises an infrared detector, in an array of such detectors and an imaging system having such detectors therein. The detector has a plurality of electrically conductive elongate members having photosensitive segments separated by non-photosensitive, conductive segments. In a further aspect, electrically isolated, conductive lines are positioned immediately above the detector surface to enhance the capture of infrared radiation.

Although several embodiments of the invention have been illustrated in the accompanying drawings and described in the foregoing detailed description, it will be understood that the invention is not limited to the embodiments disclosed, but is capable of numerous rearrangements, modifications and substitutions without departing from the scope of the invention.

What I claim is:

1. A detector for infrared radiation, comprising:

a plurality of elongate, segmented, electrically conductive members, each member comprising a plurality of photosensitive segments responsive to said infrared radiation and a plurality of non-photosensitive segments which are not responsive to said infrared radiation, said photosensitive segments having each of the linear dimensions thereof less than the wavelength of said infrared radiation, said photosensitive segments and said non-photosensitive segments positioned alternately and electrically connected in series to form each of said members, a plane reflective to said infrared radiation, said plane offset from said photosensitive segments by less than the wavelength of said radiation, and electrical conductors connected to said elongate, segmented, electrically conductive members for conveying signals produced by said photosensitive segments in response to said infrared radiation.

2. A detector for infrared radiation as recited in claim 1 wherein said photosensitive elements are spared apart along said elongate members by less than the wavelength of said radiation.

3. A detector for infrared radiation as recited in claim 1, wherein said elongate members are spaced apart by less than the wavelength of said radiation.

4. A detector for infrared radiation as recited in claim 1 wherein said photosensitive and said non-photosensitive segments have substantially the same dielectric constant.

5. A detector for infrared radiation as recited in claim 1 wherein said conductive members are parallel to each other.

6. A detector for infrared radiation as recited in claim 1 wherein said plane is a layer of aluminum.

7. A detector for infrared radiation as recited in claim 1 wherein the wavelength of said infrared radiation is in the band of 8–12 microns.

8. A detector for infrared radiation as recited in claim 1, wherein said photosensitive segments comprise mercury cadmium telluride having an alloy ratio of x equal to approximately 0.15.

9. A detector for infrared radiation as recited in claim 1 wherein said non-photosensitive segments are mercury cadmium telluride having an alloy ratio of x equal to or greater than 0.2.

10. A detector for infrared radiation as recited in claim 1 including a plurality of parallel conductors positioned on the opposite side of said photosensitive segments from said reflective plane and spaced offset from said photosensitive segments by less than the wavelength of said radiation, and said parallel conductors spaced apart from each other by less than the wavelength of said radiation.

11. A detector for infrared radiation as recited in claim 1 wherein said photosensitive segments comprise a dielectric material which absorbs and conducts said infrared radiation.

12. A detector for infrared radiation as recited in claim 1 wherein said photosensitive segments have a dielectric index n of approximately 3.6.

13. A detector for infrared radiation as recited in claim 1 wherein said non-photosensitve segments comprise a material which does not absorb said infrared radiation.

14. A detector for infrared radiation as recited in claim 1 wherein said non-photosensitive segments have a dielectric index n of approximately 23.6.

15. A detector for infrared radiation comprising:
a plurality of elongate, segmented, electrically conductive members, each member comprising a plurality of photosensitive segments responsive to said infrared radiation and a plurality of non-photosensitive segments which are not responsive to said infrared radiation, and said conductive members being spaced apart by less than the wavelength of said infrared radiation,
said photosensitive segments and said non-photosensitive segments positioned alternately and electrically connected in series to form each of said members, said photosensitive segments in each said member being spaced apart by less than the wavelength of said infrared radiation,
a plane reflective to said infrared radiation, said plane offset from said photosensitive segments by less than the wavelength of said infrared radiation, and
electrical conductors connected to said elongate, segmented, electrically conductive members for conveying signals produced by said photosensitive segments in response to said infrared radiation.

16. A detector for infrared radiation as recited in claim 15 wherein said photosensitive and said non-photosensitive segments have substantially the same dielectric constant.

17. A detector for infrared radiation as recited in claim 15 wherein said elongate conductive members are parallel to each other.

18. A detector for infrared radiation as recited in claim 15 wherein said photosensitive segments comprise a dielectric material which absorbs and conducts said infrared radiation.

19. A detector for infrared radiation as recited in claim 15 wherein said plane is a layer of aluminum.

20. A detector for infrared radiation as recited in claim 15 wherein the wavelength of said infrared radiation is in the band of 8–12 microns.

21. A detector for infrared radiation as recited in claim 15 wherein said photosensitive segments are mercury cadmium telluride having an alloy ratio of X equal to approximately 0.15.

22. A detector for infrared radiation as recited in claim 15 wherein said non-photosensitive segments are mercury cadmium telluride having an alloy ratio of X equal to or greater than 0.2.

23. A detector for infrared radiation as recited in claim 15 including a plurality of parallel conductors positioned on the opposite side of said photosensitive segments from said reflective plane and spaced offset from said photosensitive segments by less than the wavelength of said radiation, and said parallel conductors spaced apart from each other by less than the wavelength of said radiation.

24. A detector for infrared radiation as recited in claim 15 wherein said non-photosensitive segments comprise a material which does not absorb said infrared radiation.

25. A detector for infrared radiation as recited in claim 15 wherein said photosensitive segments have a dielectric index n of approximately 3.6.

26. A detector for infrared radiation as recited in claim 15 wherein said non-photosensitive segments have a dielectric index n of approximately 3.6.

27. A detector for infrared radiation comprising:
a substrate;
a plurality of non-conductive segments on said substrate,
a plurality of electrically conductive, elongate members supported on said nonconductive segments and spaced apart by less than the wavelength of said radiation, each said member comprising a plurality of photosensitive detector segments spaced apart along the member by less than the wavelength of said radiation, with non-photosensitive segments separating said photosensitive segments, said photosensitive and said non-photosensitive segments having substantially the same dielectric constant,
a radiation reflecting plane offset from said elongate members by less than the wavelength of said radiation, wherein said radiation is captured by said radiation detector and power of said radiation is conveyed to said photosensitive detector segments which produce detection signals therefrom, and electrical conductors connected to said elongate members for conveying said detection signals produced by said photosensitive detector segments.

28. A detector for infrared radiation as recited in claim 27 wherein said elongate, conductive members are parallel to each other.

29. A detector for infrared radiation as recited in claim 27 wherein said photosensitive segments comprise a dielectric material which absorbs and conducts infrared radiation.

30. A detector for infrared radiation as recited in claim 27 wherein said photosensitive detector segments have a dielectric index n of approximately 3.6.

31. A detector for infrared radiation as recited in claim 27 wherein said photosensitive and said non-photosensitive segments have substantially the same dielectric constant.

32. A detector for infrared radiation as recited in claim 27 wherein said plane is a layer of aluminum.

33. A detector for infrared radiation as recited in claim 27 wherein said non-photosensitive segments have a dielectric index n of approximately 3.6.

34. A detector for infrared radiation as recited in claim 27 wherein said non-photosensitive segments comprise a dielectric material which does not absorb said infrared radiation.

35. A detector for infrared radiation as recited in claim 27 wherein said photosensitive segments comprise mercury cadmium telluride having an alloy ratio of X equal to approximately 0.15.

36. A detector for infrared radiation as recited in claim 27 wherein said non-photosensitive segments comprise mercury cadmium telluride having an alloy ratio X equal to or greater than 0.2.

37. A detector for infrared radiation comprising;
a plurality of electrically conductive, elongate members supported on said substrate and spaced apart by less than the wavelength of said radiation, each said member comprising a plurality of photosensitive detector segments which are responsive to said infrared radiation and are spaced apart along the member by less than the wavelength of said radiation, with non-photosensitive segments which are not responsive to said radiation separating said photosensitive segments, said photosensitive and said non-photosensitive segments having substantially the same dielectric constant, a radiation reflecting plane offset from said elongate members by less than the wavelength of said radiation, wherein said radiation is captured by said photosensitive detector and power of said radiation is conveyed to said detector segments which produce detection signals therefrom, a plurality of elongate, electrically conductive, non-photosensitive members spaced apart by less than the wavelength of said radiation and offset in a plane from said elongate members by less than the wavelength of said radiation, and electrical conductors connected to said elongate members having photosensitive segments for conveying said detection signals produced by said photosensitive detector segments.

38. A detector for infrared radiation as recited in claim 37 wherein said elongate members having photosensitive segments are parallel to each other.

39. A detector for infrared radiation as recited in claim 37 wherein said elongate, non-photosensitive members are on the opposite side of said elongate members having photosensitive segments from said reflecting plane.

40. A detector for infrared radiation as recited in claim 37 wherein said non-photosensitive members are parallel to each other.

41. A detector for infrared radiation as recited in claim 37 wherein said photosensitive detector segments have a dielectric constant n of at least 3.6.

42. A detector for infrared radiation as recited in claim 37 wherein said photosensitive detector segments are dielectrics which absorb and conduct infrared radiation.

43. A detector for infrared radiation as recited in claim 37 wherein said non-photosensitive segments are dielectrics which do not absorb infrared radiation.

44. A detector for infrared radiation as recited in claim 37 wherein said photosensitive detector segments have a dielectric constant n of at least 3.6.

45. An infrared detector array for producing an infrared image from infrared radiation comprising:

a plurality of infrared detectors positioned in a planar array, each detector comprising;

a plurality of elongate, segmented, electrically conductive members, each member comprising a plurality of photosensitive segments responsive to said infrared radiation and a plurality of non-photosensitive segments which are not responsive to said infrared radiation, and said conductive members spaced apart by less than the wavelength of said infrared radiation, said photosensitive segments and said non-photosensitive segments positioned alternately and electrically connected in series to form each of said members, said photosensitive segments in each said member spaced apart by less than the wavelength of said infrared radiation, a plane reflective to said infrared radiation, said plane offset from said photosensitive segments by less than the wavelength of said infrared radiation, and electrical conductors connected to said elongate, segmented, electrically conductive members for extracting signals produced by said photosensitive segments in response to said infrared radiation.

46. An infrared detector array for producing an infrared image from infrared radiation comprising:

a plurality of infrared detectors positioned in a planar array, each detector comprising;

a substrate;

a plurality of electrically conductive, elongate members supported on said substrate and spaced apart by less than the wavelength of said radiation, each said member comprising a plurality of photosensitive detector segments spaced apart along the member by less than the wavelength of said radiation, with non-photosensitive segments separating said photosensitive segments, said photosensitive and said non-photosensitive segments having substantially the same dielectric constant a radiation reflecting plane offset from said elongate members by less than the wavelength of said radiation, wherein said radiation is captured by said radiation detector and power of said radiation is conveyed to said photosensitive detector segments which produce detection signals therefrom, and electrical conductors connected to said elongate members for conveying said detection signals produced by said photosensitive detector segments.

47. An infrared detector array for producing an infrared image from infrared radiation comprising:

a plurality of infrared detectors positioned in a planar array, each detector comprising;

a plurality of electrically conductive, elongate members supported on said substrate and spaced apart by less than the wavelength of said radiation, each said member comprising a plurality of photosensitive detector segments which are responsive to said infrared radiation and are spaced apart along the member by less than the wavelength of said radiation, with non-photosensitive segments which are not responsive to said radiation separating said photosensitive segments, said photosensitive and said non-photosensitive segments having substantially the same dielectric constant, a radiation reflecting plane offset from said elongate members by less than the wavelength of said radiation, wherein said radiation is captured by said photosensitive detector and power of said radiation is conveyed to said detector segments which produce detection signals therefrom, a plurality of elongate, electrically conductive, non-photosensitive members spaced apart by less than the wavelength of said radiation and offset from said elongate members by less than the wavelength of said radiation, and electrical conductors connected to said elongate members having photosensitive segments for conveying said detection signals produced by said photosensitive detector segments.

48. A detector for infrared radiation comprising:

a dielectric substrate, an array of insulating blocks on the surface of said substrate, said insulating blocks organized in elongate groups, wherein the insulating blocks in each group are spaced apart by less than the wavelength of said infrared radiation and said groups are spaced apart by less than said wavelength, a plurality of photosensitive segments positioned respectively on the surfaces of said insulating blocks, said photosensitive segments having essentially the same lateral dimensions as said insulating blocks and have a thickness less than said wavelength, a plurality of electrically conducting bridging segments for respectively connecting pairs of said photosensitive segments within said groups for producing a plurality of elongate, conducting members comprising alternating ones of photosensitive segments and said conducting bridging segments, a reflecting plane positioned on the opposite side of said substrate from said photosensitive segments and offset from said photosensitive segments by a distance less than said wavelength, and first and second electrical conductors connected to each of said elongate, conducting members for providing a conduction path for detection signals produced by said photosensitive segments in response to said infrared radiation.

49. A detector for infrared radiation as recited in claim 48 wherein there is a heterojunction at each interface between said photosensitive segments and said electrically conducting bridge segments.

50. A detector for infrared radiation as recited in claim 48 wherein there is a blocking junction at each interface between said photosensitive segments and said insulating blocks.

51. A detector for infrared radiation as recited in claim 48 wherein said elongate members are parallel to each other.

52. A detector for infrared indication as recited in claim 48 including a plurality of parallel conductors positioned above said photosensitive segments by less than the wavelength of said indication, spaced apart from each other by less than said wavelength and aligned perpendicular to said elongate groups.

53. A nonpolarized detector for infrared radiation comprising:

a dielectric substrate, an array of insulating blocks on the surface of said substrate, said insulating blocks comprising first and second sets each having a plurality of groups of said blocks, each group comprising an elongate collection of said blocks, wherein the groups in said first set are parallel to each other and the groups in said second set are parallel to each other and said groups in said first and second sets are perpendicular to each other, wherein the insulating blocks in each group are spaced apart by less than the wavelength of said infrared radiation and said parallel groups are spaced apart by less than the wavelength of said radiation, a plurality of photosensitive segments positioned respectively on the surfaces of said insulating blocks, said photosensitive segments having essentially the same lateral dimensions as said insulating blocks and have a thickness less than said wavelength, a plurality of X-shaped electrically conducting bridging segments for respectively connecting a pair of adjacent ones of said photosensitive segments from within said first set to an adjacent pair of said photosensitive segments from within said second set for producing a plurality of elongate, conducting members comprising alternating ones of photosensitive segments and said conducting bridging segments, a half of said conducting members parallel to each other and perpendicular to the other half of said conducting members, which are parallel to each other, a reflecting plane positioned on the opposite side of said substrate from said photosensitive segments and offset from said photosensitive segments by a distance less than said wavelength, and first and second electrical conductors connected to each of said elongate, conducting members for providing a conduction path for detection signals produced by said photosensitive segments in response to said infrared radiation.

54. A nonpolarized detector for infrared radiation as recited in claim 53 wherein there is a heterojunction at each interface between said photosensitive segments and said electrically conducting bridge segments.

55. A nonpolarized detector for infrared radiation as recited in claim 53 wherein there is a blocking junction at each interface between said photosensitive segments and said insulating blocks.

* * * * *